(12) United States Patent
Watanabe

(10) Patent No.: US 9,501,119 B2
(45) Date of Patent: Nov. 22, 2016

(54) SEMICONDUCTOR DEVICE AND ELECTRONIC DEVICE

(71) Applicant: Semiconductor Energy Laboratory Co., Ltd., Kanagawa-ken (JP)

(72) Inventor: Kazunori Watanabe, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/608,844

(22) Filed: Jan. 29, 2015

(65) Prior Publication Data

US 2015/0149795 A1 May 28, 2015

Related U.S. Application Data

(63) Continuation of application No. 14/013,517, filed on Aug. 29, 2013, now Pat. No. 8,947,158.

(30) Foreign Application Priority Data

Sep. 3, 2012 (JP) ................................. 2012-193330

(51) Int. Cl.
*G06F 1/26* (2006.01)
*G06F 1/32* (2006.01)
*H02M 3/158* (2006.01)
*H02M 3/07* (2006.01)
*G06F 1/10* (2006.01)

(52) U.S. Cl.
CPC . *G06F 1/26* (2013.01); *G06F 1/10* (2013.01); *G06F 1/3234* (2013.01); *G06F 1/3287* (2013.01); *H02M 3/073* (2013.01); *H02M 3/158* (2013.01); *H02M 2003/078* (2013.01); *Y02B 60/1282* (2013.01)

(58) Field of Classification Search
None
See application file for complete search history.

(56) References Cited

U.S. PATENT DOCUMENTS

| | | | | |
|---|---|---|---|---|
| 3,648,065 | A | * | 3/1972 | Hoffman ......................... 377/79 |
| 5,408,140 | A | * | 4/1995 | Kawai et al. ................. 327/536 |
| 5,489,870 | A | | 2/1996 | Arakawa |
| 5,604,707 | A | * | 2/1997 | Kuge et al. ................... 365/226 |
| 5,731,856 | A | | 3/1998 | Kim et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Fortunato, E.M.C. et al., "Wide-Bandgap High-Mobility ZnO Thin-Film Transistors produces at Room Temperature," Applies Physics Letters, Sep. 27, 2004, vol. 85, No. 13, pp. 2541-2543.

(Continued)

*Primary Examiner* — Thomas J Hiltunen
(74) *Attorney, Agent, or Firm* — Husch Blackwell LLP

(57) ABSTRACT

To reduce a variation in the electrical characteristics of a transistor. A potential generated by a voltage converter circuit is applied to a back gate of a transistor included in a voltage conversion block. Since the back gate of the transistor is not in a floating state, a current flowing through the back channel can be controlled so as to reduce a variation in the electrical characteristics of the transistor. Further, a transistor with low off-state current is used as the transistor included in the voltage conversion block, whereby storage of the output potential is controlled.

25 Claims, 13 Drawing Sheets

(56) References Cited

U.S. PATENT DOCUMENTS

| | | | |
|---|---|---|---|
| 5,744,864 A | 4/1998 | Cillessen et al. | |
| 5,815,446 A | 9/1998 | Tobita | |
| 5,892,267 A | 4/1999 | Takada | |
| 5,973,311 A * | 10/1999 | Sauer et al. | 250/208.1 |
| 6,069,518 A | 5/2000 | Nakai et al. | |
| 6,163,487 A | 12/2000 | Ghilardelli | |
| 6,172,886 B1 | 1/2001 | Lauterbach et al. | |
| 6,175,264 B1 | 1/2001 | Jinbo | |
| 6,226,207 B1 * | 5/2001 | Suh | 365/190 |
| 6,294,274 B1 | 9/2001 | Kawazoe et al. | |
| 6,329,869 B1 * | 12/2001 | Matano | 327/536 |
| 6,563,174 B2 | 5/2003 | Kawasaki et al. | |
| 6,603,346 B2 | 8/2003 | Sawada et al. | |
| 6,664,846 B1 | 12/2003 | Maung et al. | |
| 6,727,522 B1 | 4/2004 | Kawasaki et al. | |
| 6,747,897 B2 | 6/2004 | Karaki | |
| 6,791,882 B2 | 9/2004 | Seki et al. | |
| 6,847,250 B2 | 1/2005 | Kim | |
| 6,914,791 B1 * | 7/2005 | Park et al. | 363/60 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,072,193 B2 * | 7/2006 | Lin | H02M 3/073 363/59 |
| 7,105,868 B2 | 9/2006 | Nause et al. | |
| 7,145,191 B1 * | 12/2006 | Teng | H01L 21/823807 257/288 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,335,540 B2 * | 2/2008 | Peng | H01L 27/1214 257/E21.413 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,602,231 B2 | 10/2009 | Yamamoto et al. | |
| 7,674,650 B2 | 3/2010 | Akimoto et al. | |
| 7,732,819 B2 | 6/2010 | Akimoto et al. | |
| 7,777,557 B2 | 8/2010 | Yamahira | |
| 7,859,486 B2 * | 12/2010 | Kwon | 345/66 |
| 7,863,611 B2 * | 1/2011 | Abe | H01L 29/7869 257/56 |
| 8,004,907 B2 | 8/2011 | Russell et al. | |
| 8,107,279 B2 | 1/2012 | Yamaoka et al. | |
| 8,209,504 B2 | 6/2012 | Nakanishi et al. | |
| 8,222,953 B2 | 7/2012 | Nakamura | |
| 8,314,648 B2 * | 11/2012 | Nishi | H02M 3/073 327/536 |
| 8,541,814 B2 * | 9/2013 | Chidambarrao | H01L 21/823412 257/190 |
| 8,598,945 B2 | 12/2013 | Gorisse | |
| 8,665,255 B2 * | 3/2014 | Tsujino | H02M 3/073 323/220 |
| 8,718,224 B2 * | 5/2014 | Toyotaka | 377/64 |
| 8,773,906 B2 | 7/2014 | Ohmaru | |
| 8,937,580 B2 * | 1/2015 | Miyagawa | 345/76 |
| 8,947,158 B2 * | 2/2015 | Watanabe | 327/536 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0184360 A1 | 10/2003 | Wang et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0133172 A1 * | 6/2006 | Schnabel et al. | 365/211 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089927 A1 | 4/2011 | Yamazaki et al. | |
| 2011/0101942 A1 | 5/2011 | Yamazaki et al. | |
| 2011/0102409 A1 * | 5/2011 | Hayakawa | 345/212 |
| 2011/0216566 A1 | 9/2011 | Kamata | |
| 2012/0161139 A1 | 6/2012 | Endo et al. | |
| 2012/0193620 A1 | 8/2012 | Godo et al. | |
| 2012/0195138 A1 | 8/2012 | Son | |
| 2013/0300462 A1 | 11/2013 | Koyama et al. | |
| 2013/0314152 A1 | 11/2013 | Matsuzaki et al. | |
| 2014/0077786 A1 | 3/2014 | Shionoiri et al. | |

FOREIGN PATENT DOCUMENTS

| | | |
|---|---|---|
| JP | 60-198861 A | 10/1985 |
| JP | 63-210022 A | 8/1988 |

(56) References Cited

FOREIGN PATENT DOCUMENTS

| JP | 63-210023 A | 8/1988 |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-171700 A | 9/2011 |
| WO | WO 2004/114391 A1 | 12/2004 |

OTHER PUBLICATIONS

Dembo, H. et al., "RFCPUS on Glass and Plastic Substrates Fabricated by TFT transfer technology," IEDM 05: Technical Digest of International Electron Devices Meeting, Dec. 5, 2005, pp. 1067-1069.

Ikeda, T. et al., "21.2: Full-Functional System Liquid Crystal Display Using CG-Silicon Technology," SID Digest of Technical Papers, 2004, vol. 35, pp. 860-863.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Park, J.-S. et al., "Improvements in the Device Characteristics of Amorphous Indium Gallium Zinc Oxide Thin-Film Transistors by Ar Plasma Treatment," Apllied Physics Letters, Jun. 26, 2007, vol. 90, No. 26, pp. 262106-1-262106-3.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Hayash, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins, M. et al., "A Ferroelectric Transparent Thin-Film Transistor," Applied Physics Letters, Jun. 17, 1996, vol. 68, No. 25, pp. 3650-3652.

Nakamura, M. et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka, N. et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura, K. et al., "Thin-Film Transistor Fabricated in Single-Crystalline Transparent Oxide Semiconductor," Science, May 23, 2003, vol. 300, No. 5623, pp. 1269-1272.

Masuda, S. et al., "Transparent Thin Film Transistors Using ZnO as an Active Channel Layer and their Electrical Properties," Journal of Applied Physics, Feb. 1, 2003, vol. 93, No. 3, pp. 1624-1630.

Asakuma, N. et al., "Crystallization and Reduction of Sol-Gel-Derived Zinc Oxide Films by Irradiation with Ultraviolet Lamp," Journal of Sol-Gel Science and Tehcnology, 2003, vol. 26, pp. 181-184.

Osada, T. et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura, K. et al., "Carrier Transport in Transparent Oxide Semiconductor with Intrinsic Structural Randomness Probed Using Single-Crystalline $InGaO_3(ZnO)5$ Films," Applied Physics Letters, Sep. 13, 2004, vol. 85, No. 11, pp. 1993-1995.

Li, C. et al., "Modulated Structures of Homologous Compounds $InMO_3(ZnO)m$ (M=In,Ga; m=Integer) Described by Four-Dimensional Superspace Group," Journal of Solid State Chemistry, 1998, vol. 139, pp. 347-355.

Son, K. et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08; SID International Symposium Digest of Tehcnical Papers, May 20, 2008, vol. 39, pp. 633-636.

Lee, J. et al., "World'S Largest (15-Inch) XGA AMLCD Panel Using IGZO Oxide TFT," SID Digest '08: SID International Symposium Digest of Technical Papers, May 20, 2008, vol. 39, pp. 625-628.

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Kanno, H. et al., "White Stacked Electrophosphorecent Organic Light-Emitting Devices Employing $MoO_3$ as a Charge-Generation Layer," Advanced Materials, 2006, vol. 18, No. 3, pp. 339-342.

Tsuda, K. et al., "Ultra Low Power Consumption Technologies for Mobile TFT-LCDs," IDW '02: Proceedings of the 9th International Display Workshops, Dec. 4, 2002, pp. 295-298.

Van de Walle, C., "Hydrogen as a Cause of Doping in Zinc Oxide," Physical Review Letters, Jul. 31, 2000, vol. 85, No. 5, pp. 1012-1015.

Fung, T. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong, J. et al., "3.1: Distinguished Paper: 12.1-Inch WXGA AMOLED Display Driven by Indium—Gallium—Zinc—Oxide TFTs Array," SID Digest '08: SID International Symposium Digest of Technical Papers, May 20, 2008, vol. 39, No. 1, pp. 1-4.

Park, J. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Kurokawa, Y. et al., "UHF RFCPUS on Flexible and Glass Substrates for Secure RFID Systems," Journal of Solid-State Circuits, 2008, vol. 43, No. 1, pp. 292-299.

Ohara, H. et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates, D. et al., "Optical Studies of the Amorphous Liquid-Cholesteric Liquid Crystal Transition: The Blue Phase", Physics Letters, Sep. 10, 1973, vol. 45A, No. 2, pp. 115-116.

Cho, D. et al., "21.2:Al and Sn-Doped Zinc Indium Oxide Thin Film Transistors for AMOLED Back-Plane," SID Digest '09: SID International Symposium Digest of Technical Papers, May 31, 2009, pp. 280-283.

Lee, M. et al., "15.4:Excellent Performance of Indium—Oxide-Based Thin-Film Transistors by DC Spittering," SID Digest '09: SID International Symposium Digest of Technical Papers, May 31, 2009, pp. 191-193.

Jin, D. et al., "65.2:Distinguished Paper:World-Largest (6.5") Flexible Full Color Top Emission AMOLED Display on Plastic Film and its Bending Properties," SID Digest '09: SID International Symposium Digest of Technical Papers, May 31, 2009, pp. 983-985.

Sakata, J. et al., "Development of 4.0In. AMOLED Display with Driver Circuit Using Amorphous In—Ga—Zn—Oxide TFTs," IDW '09: Proceedings of the 16th International Display Workshops, 2009, pp. 689-692.

Park, J. et al., "Amorphous Indium—Gallium—Zinc Oxide TFTs and their Application for Large Size AMOLED," AM-FPD '08 Digest of Technical Papers, Jul. 2, 2008, pp. 275-278.

(56) References Cited

OTHER PUBLICATIONS

Park, S. et al., "Challenge to Future Displays: Transparent AM-OLED Driven by Peald Grown ZnO TFT," IMID '07 Digest, 2007, pp. 1249-1252.
Godo, H. et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hirao, T. et al., "Novel Top-Gate Zinc Oxide Thin-Film Transistors (ZnO TFTs) for AMLCDS," Journal of the Society for Information Display, 2007, vol. 15, No. 1, pp. 17-22.
Hosono, H., "68.3: Invited Paper: Transparent Amorphous Oxide Semiconductors for High Perfomance TFT," SID Digest '07: SID International Symposium Digest of Technical Papers, 2007, vol. 38, pp. 1830-1833.
Godo, H. et al., "P-9:Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Ohara, H. et al., "21.3:4.0 In. QVGA AMOLED Display Using In—Ga—Zn—Oxide TFTs With a Novel Passivation Layer," SID Digest '09: SID International Symposium Digest of Technical Papers, May 31, 2009, pp. 284-287.
Miyasaka, M., "SUFTLA Flexible Microelectronics on Their Way to Business," SID Digest '07: SID International Symposium Digest of Technical Papers, 2007, vol. 38, pp. 1673-1676.
Chern, H. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Kikuchi, H. et al., "39.1: Invited Paper:Optically Isotropic Nano-Structured Liquid Crystal Composited for Display Applications," SID Digest '09: SID International Symposium Digest of Technical Papers, May 31, 2009, pp. 578-581.
Asaoka, Y. et al., "29.1: Polarizer-Free Reflective LCD Combined With Ultra Low-Power Driving Technology," SID Digest '09: SID Digest '09: SID International Symposium Digest of Technical Papers, May 31, 2009, pp. 395-398.
Lee, H. et al., "Current Status of, Challenges to, and Perspective View of AM-OLED," IDW '06: Proceedings of the 13th International Display Workshops, Dec. 7, 2006, pp. 663-666.
Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740
Nakamura, M. "Synthesis of Homologous Compound with New Long-Period Structure," NIRIM Newsletter, Mar. 1, 1995, vol. 150, pp. 1-4.
Kikuchi, H. et al., "Polymer-Stabilized Liquid Crystal Blue Phases," Nature Materials, Sep. 2, 2002, vol. 1, pp. 64-68.
Kimizuka, N. et al., "Spinel,YBFE2O4, and YB2FE3O7 Types of Structures for Compounds in the IN2O3 and SC2O3-A2O3-BO Systems [A; Fe; Ga, or Al; B; Mg, Mn, Fe, Ni, Cu, or Zn]at Temperatures Over 1000° C.," Journal of Solid State Chemistry, 1985, vol. 60, pp. 382-384.
Kitzerow, H. et al., "Observation of Blue Phases in Chiral Networks," Liquid Crystals, 1993, vol. 14, No. 3, pp. 911-916.
Costello, M. et al., "Electron Microscopy of a Cholesteric Liquid Crystal and Its Blue Phase," Physical Review. A, May 1, 1984, vol. 29, No. 5, pp. 2957-2959.
Meiboom, S. et al., "Theory of the Blue Phase of Cholesteric Liquid Crystals,"Physical Review Letters, May 4, 1981, vol. 46, No. 18, pp. 1216-1219.
Park, Sang-Hee et al., "42.3: Transparent ZnO Thin Film Transistor for the Application of High Aperature Ratio Bottom Emission AM-OLED Display," SID Digest '08: SID International Symposium Digest of Technical Papers, May 20, 2008, vol. 39, pp. 629-632.
Orita, M. et al., "Mechanism of Electrical Conductivity of Transparent InGaZnO4,"Physical Review. B, Jan. 15, 2000, vol. 61, No. 3, pp. 1811-1816,
Nomura, K. et al., "Amorphous Oxide Semiconductors for High-Performance Flexible Thin-Film Transistors," Japanese Journal of Applied Physics, 2006, vol. 45, No. 5B, pp. 4303-4308.
Janotti, A. et al., "Native Point Defects in ZnO," Physical Review. B, Oct. 4, 2007, vol. 76, No. 16, pp. 165202-1-165202-22.
Park, J. et al., "Electronic Transport Properties of Amorphous Indium—Gallium—Zinc Oxide Semiconductor upon Exposure to Water," Applied Physics, 2008, vol. 92, pp. 072104-1-072104-3.
Hsieh, H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.
Janotti, A. et al., "Oxygen Vacancies in ZnO," Applied Physics Letters, 2005, vol. 87, pp. 122102-1-122102-3.
Oba, F. et al., "Defect Energetics in ZnO: A Hybrid Hartree-Fock Density Functional Study," Physical Review. B, 2008, vol. 77, pp. 245202-1-245202-6.
Orita, M. et al., "Amorphous Transparent Conductive Oxide InGaO3(ZnO)m (m<4):a Zn4s Conductor," Philosophical Magazine, 2001, vol. 81, No. 5, pp. 501-515.
Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.
Mo, Y. et al., "Amorphous Oxide TFT Backplanes for Large Size AMOLED Displays," IDW '08: Proceedings of the 6th International Display Workshops, Dec. 3, 2008, pp. 581-584.
Kim, S. et al., "High-Performance Oxide Thin Film Transistors Passivated by Various Gas Plasmas,"214th ECS Meeting, 2008, No. 2317, ECS.
Clark, S. et al., "First Principles Methods Using Castep," Zeitschrift fur Kristallographie, 2005, vol. 220, pp. 567-570.
Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.
Park, J. et al., "Dry Etching of ZnO Films and Plasma-Induced Damage to Optical Properties,"Journal of Vacuum Science & Technology B, Mar. 1, 2003, vol. 21, No. 2, pp. 800-803.
Oh, M. et al., "Improving the Gate Stability of ZNO Thin-Film Transistors With Aluminum Oxide Dielectric Layers," Journal of the Electrochemical Society, 2008, vol. 155, No. 12, pp. H1009-H1014.
Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

* cited by examiner

SEMICONDUCTOR DEVICE AND ELECTRONIC DEVICE

This application is a continuation of copending U.S. application Ser. No. 14/013,517, filed on Aug. 29, 2013 which is incorporated herein by reference.

BACKGROUND OF THE INVENTION

Field of the Invention

One embodiment of the present invention relates to a voltage converter circuit. Furthermore, one embodiment of the present invention relates to a semiconductor device. Still further, one embodiment of the present invention relates to an electronic device.

Description of the Related Art

A power source circuit is used for generating a power source voltage of a semiconductor device such as a processor.

The power source circuit is provided with a voltage converter circuit such as a charge pump.

The voltage converter circuit includes a plurality of voltage conversion blocks composed of, for example, transistors and capacitors, and converts a voltage by converting an input potential in accordance with a clock signal.

Examples of a transistor in the voltage converter circuit include a transistor using silicon semiconductor for a channel formation region, and a transistor using a metal oxide semiconductor for a channel formation region. For example, Patent Document 1 discloses a voltage converter circuit in which a metal oxide semiconductor is used for a channel formation region of a transistor.

REFERENCE

Patent Document

[Patent Document 1] Japanese Published Patent Application No. 2011-171700

SUMMARY OF THE INVENTION

Conventional voltage converter circuits have a problem in that the electrical characteristics of a transistor vary with a current flowing through a back channel of the transistor.

For example, in the case of an n-channel transistor, the threshold voltage shifts in a negative direction with an increase in the current flowing through the back channel. A negative threshold voltage leads to an increase in off-state current. In order to reduce the off-state current of the n-channel transistor, a negative potential needs to be continuously applied to a gate, which consumes power accordingly.

In the case where a transistor includes a pair of gates with a channel formation region interposed therebetween and a gate on a back-channel side (hereinafter referred to as a back gate) is in a floating state, a current flowing through the back channel is likely to vary due to a drain potential. Therefore, a variation in the electrical characteristics of the transistor is easily caused.

An object of one embodiment of the present invention is to reduce a variation in the electrical characteristics of a transistor due to a current in a back channel. Another object of one embodiment of the present invention is to reduce power consumption. Note that in one embodiment of the present invention, at least one of these objects needs to be achieved.

In one embodiment of the present invention, a potential generated by a voltage converter circuit is applied to a back gate of a transistor included in a voltage conversion block. Since the back gate of the transistor is not in a floating state, a current flowing through the back channel can be controlled so as to reduce a variation in the electrical characteristics of the transistor.

In the above embodiment of the present invention, a transistor with low off-state current may be used as the transistor included in the voltage conversion block. The transistor with low off-state current allows the output potential to be held so as to reduce a variation in the output potential in the case where, for example, the supply of a clock signal to the voltage converter circuit is stopped. The use of the transistor with low off-state current also extends the period during which the supply of a clock signal can be stopped, resulting in a reduction in power consumption.

One embodiment of the present invention is a voltage converter circuit including a first voltage conversion block, a second voltage conversion block, and an output control transistor. The first voltage conversion block includes a first conversion control transistor and a first capacitor. The second voltage conversion block includes a second conversion control transistor and a second capacitor. A first potential is applied to one of a source and a drain of the first conversion control transistor, and a potential of a gate of the first conversion control transistor varies with a first clock signal. One of a pair of electrodes of the first capacitor is electrically connected to the other of the source and the drain of the first conversion control transistor, and a potential of the other of the pair of electrodes varies with the first clock signal. One of a source and a drain of the second conversion control transistor is electrically connected to the other of the source and the drain of the first conversion control transistor, the other of the source and the drain of the second conversion control transistor has a second potential, and a potential of a gate of the second conversion control transistor varies with a second clock signal. One of a pair of electrodes of the second capacitor is electrically connected to the other of the source and the drain of the second conversion control transistor, and the other of the pair of electrodes varies with the second clock signal. One of a source and a drain of the output control transistor varies with the second potential. A back gate of at least one of the first and second conversion control transistors is electrically connected to the other of the source and the drain of the output control transistor or the one of the source and the drain of the first conversion control transistor.

One embodiment of the present invention is a semiconductor device including a power source circuit provided with a first voltage converter circuit and a second voltage converter circuit, an oscillator configured to output a clock signal to the power source circuit, and a CPU core configured to control whether the operation of the oscillator is stopped or not. The first voltage converter circuit is configured to generate a first potential which is a negative potential. The second voltage converter circuit is configured to generate a second potential which is a positive potential. The CPU core includes a register. The register includes a first volatile memory circuit configured to store data in a period during which a power source voltage is applied to the CPU core, and a second nonvolatile memory circuit configured to store data in a period during which supply of the power source voltage to the CPU core is stopped. The second memory circuit includes a transistor for controlling writing and storage of data. The CPU core is further configured to control whether the first potential or the second potential is applied to a back gate of the transistor for controlling writing and storage of data.

One embodiment of the present invention is an electronic device including the semiconductor device.

By controlling a potential of a back gate of a transistor, a current flowing through the back channel can be controlled so as to reduce a variation in the electrical characteristics of the transistor. In addition, the potential of the back gate of the transistor can be kept even in the case where the supply of a clock signal is stopped. Accordingly, the period during which the supply of a clock signal is stopped can be extended, resulting in a reduction in power consumption.

DETAILED DESCRIPTION OF THE INVENTION

Figure 1A:
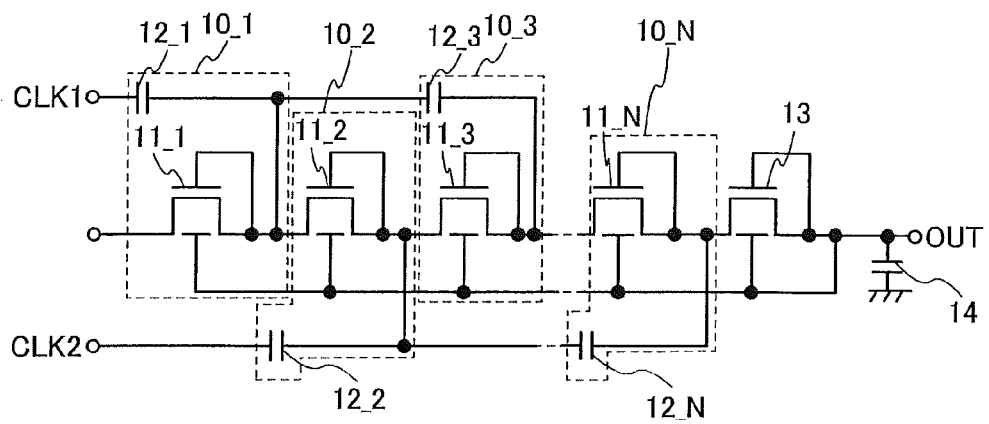
FIGS. 1A and 1B are examples of a voltage converter circuit.

Embodiments of the present invention will be described. Note that it is easily understood by those skilled in the art that details of the embodiments can be modified in various ways without departing from the spirit and scope of the invention. Accordingly, the present invention should not be limited to, for example, the description of the embodiments below.

Note that the contents in different embodiments can be combined with one another as appropriate. In addition, the contents of the embodiments can be replaced with each other as appropriate.

Ordinal numbers such as "first" and "second" are used in order to avoid confusion among components and the number of components is not limited by the ordinal numbers.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

Described in this embodiment is an example of a voltage converter circuit which is one embodiment of the present invention.

An example of the voltage converter circuit of this embodiment includes a first voltage conversion block, a second voltage conversion block, and an output control transistor. Note that two or more first voltage conversion blocks and second voltage conversion blocks may be provided.

The first voltage conversion block includes a first conversion control transistor and a first capacitor, and the second voltage conversion block includes a second conversion control transistor and a second capacitor.

A first potential is applied to one of a source and a drain of the first conversion control transistor. The potential of a gate of the first conversion control transistor varies with a first clock signal.

One of a pair of electrodes of the first capacitor is electrically connected to the other of the source and the drain of the first conversion control transistor, and the potential of the other electrode varies with the first clock signal.

One of a source and a drain of the second conversion control transistor is electrically connected to the other of the source and the drain of the first conversion control transistor. The other of the source and the drain of the second conversion control transistor has a second potential, and the potential of a gate of the second conversion control transistor varies with a second clock signal.

One of a pair of electrodes of the second capacitor is electrically connected to the other of the source and the drain of the second conversion control transistor, and the potential of the other electrode varies with the second clock signal.

The potential of one of a source and a drain of the output control transistor varies with the second potential.

The potential of a back gate of at least one of the first and second conversion control transistors varies with the first potential or the second potential. For example, the back gate of at least one of the first and second conversion control transistors is electrically connected to the other of the source and the drain of the output control transistor or the one of the source and the drain of the first conversion control transistor.

Examples of the voltage converter circuit of this embodiment will be further described with reference to FIGS. 1A and 1B, FIGS. 2A and 2B, FIGS. 3A to 3C, FIG. 4, FIGS. 5A to 5C, FIGS. 6A and 6B, and FIGS. 7A and 7B.

The voltage converter circuits illustrated in FIGS. 1A and 1B and FIGS. 2A and 2B each include voltage conversion blocks 10_2 to 10_N (N is a natural number of 2 or more) and an output control transistor 13. FIGS. 1A and 1B and FIGS. 2A and 2B illustrate examples in which N is 4 or more.

Each of the voltage conversion blocks 10_1 to 10_N has a function of converting a voltage by converting a potential to be input (also referred to as an input potential) into another potential.

Note that a voltage refers to a potential difference between two points. However, in general, a difference between the potential of one point and a reference potential (e.g., a ground potential) is merely called a potential or a voltage, and a potential and a voltage are used as synonyms in many cases. Hence, in this specification, a potential may be rephrased as a voltage and a voltage may be rephrased as a potential unless otherwise specified.

A potential converted by a voltage conversion block 10_K (K is a natural number of N−1 or less) is an input potential of a voltage conversion block 10_K+1.

Each of the voltage conversion blocks 10_1 to 10_N includes a conversion control transistor and a capacitor.

For example, as illustrated in FIGS. 1A and 1B and FIGS. 2A and 2B, a voltage conversion block 10_X (X is a natural number of 1 to N) includes a conversion control transistor 11_X and a capacitor 12_X.

The potential of one of a source and a drain of the conversion control transistor 11_X is the aforementioned input potential.

For example, in FIGS. 1A and 1B and FIGS. 2A and 2B, the potential of one of a source and a drain of the conversion control transistor 11_1 is variable or fixed. The other of the source and the drain of the conversion control transistor 11_1 is electrically connected to one of a source and a drain of the conversion control transistor 112. In other words, one of a source and a drain of a conversion control transistor 11_K+1 is electrically connected to the other of a source and a drain of a conversion control transistor 11_K.

A gate of the conversion control transistor 11_X is electrically connected to the source or the drain of the conversion control transistor 11_X.

Figure 2A:
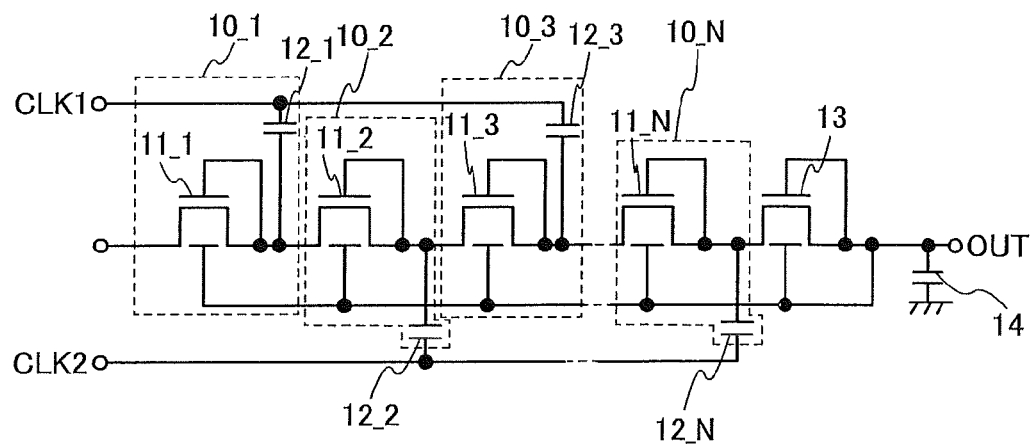
FIGS. 2A and 2B are examples of a voltage converter circuit.

For example, in FIGS. 1A and 2A, the gate of the conversion control transistor 11_X is electrically connected to the other of the source and the drain of the conversion control transistor 11_X. In that case, in each of the voltage conversion blocks 10_1 to 10_N, a potential is converted into a lower potential than before.

Figure 1B:
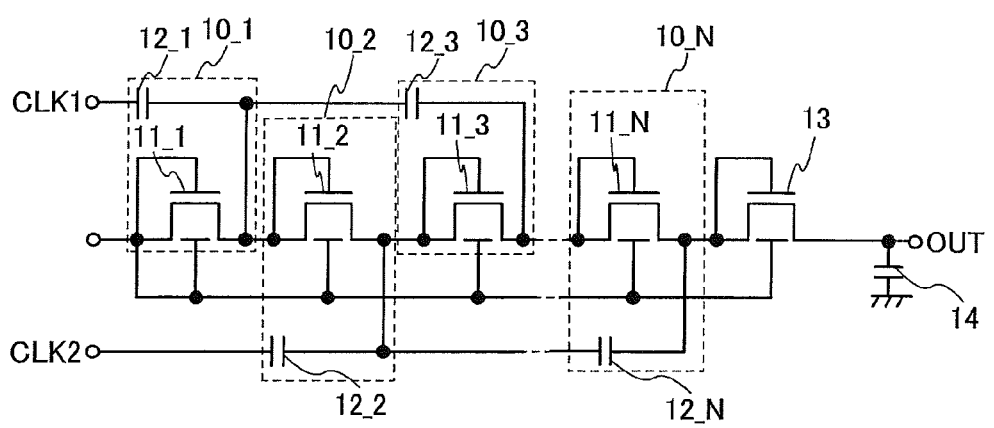
Figure 2B:
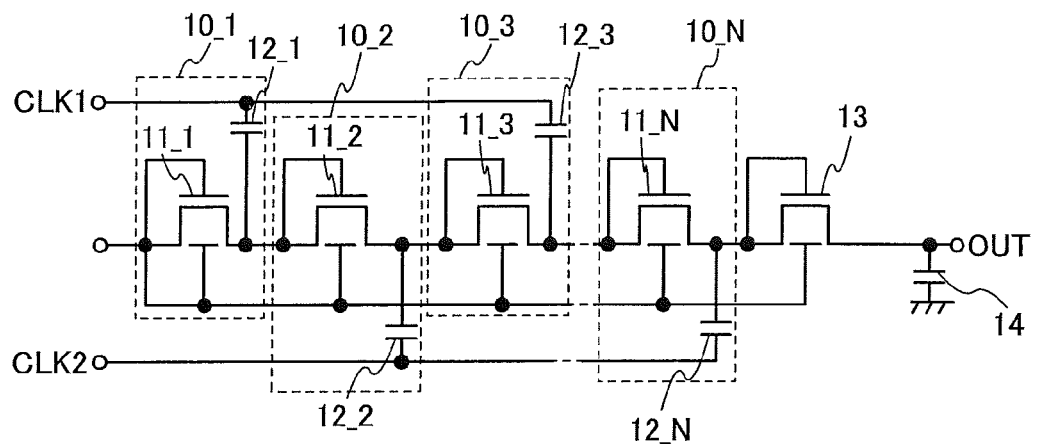

In FIGS. 1B and 2B, the gate of the conversion control transistor 11_X is electrically connected to the one of the source and the drain of the conversion control transistor 11_X. In that case, in each of the voltage conversion blocks 10_1 to 10_N, a potential is converted into a higher potential than before.

In a voltage conversion block 10_M (M is an odd number of 1 to N), the potential of a gate of a conversion control transistor 11_M varies with a clock signal CLK1, one of a pair of electrodes of a capacitor 12_M is electrically connected to the other of a source and a drain of the conversion control transistor 11_M, and the potential of the other electrode of the capacitor 12_M varies with the clock signal CLK1. Here, the voltage conversion block 10_M corresponds to the first voltage conversion block.

For example, in FIGS. 1A and 1B, the clock signal CLK1 is input to the other electrode of the capacitor 12_1. Further, the other electrode of a capacitor 12_m (m is an odd number of 3 to N) is electrically connected to one of a pair of electrodes of a capacitor 12_m−2.

In FIGS. 2A and 2B, the clock signal CLK1 is input to the other electrode of the capacitor 12_M.

In a voltage conversion block 10_L (L is an even number of 2 to N), the potential of a gate of a conversion control transistor 11_L varies with a clock signal CLK2, one of a pair of electrodes of a capacitor 12_L is electrically connected to the other of a source and a drain of the conversion control transistor 11_L, and the potential of the other electrode of the capacitor 12_L varies with the clock signal CLK2. The clock signal CLK2 has a phase opposite to that of the clock signal CLK1. Here, the voltage conversion block 10_L corresponds to the second voltage conversion block.

For example, in FIGS. 1A and 1B, the clock signal CLK2 is input to the other electrode of the capacitor 12_2. Further, the other electrode of a capacitor 12_l (l is an even number of 4 to N) is electrically connected to one of a pair of electrodes of a capacitor 12_l−2.

In FIGS. 2A and 2B, the clock signal CLK2 is input to the other electrode of the capacitor 12_L.

Note that the phrase "the potential varies with the signal" is not limited to the case where "the signal is directly input so that the potential has the potential of the signal", but includes the case where, for example, "a transistor is turned on with the signal so that the potential varies" or "the potential varies when the signal varies due to capacitive coupling".

One of a source and a drain of the output control transistor 13 is electrically connected to the other of a source and a drain of a conversion control transistor 11_N included in the voltage conversion block 10_N. A gate of the output control transistor 13 is electrically connected to the other of the source and the drain of the output control transistor 13; however, one embodiment of the present invention is not limited to this structure and a signal may be input to the gate of the output control transistor 13, for example.

The output potential of the voltage converter circuit is stored in a capacitor 14. The capacitor 14 may be formed using, for example, parasitic capacitance generated between a wiring for outputting the output potential and another wiring. Alternatively, the capacitor 14 may be formed using a capacitor additionally provided.

In at least one of the voltage conversion blocks 10_1 to 10_N, the back gate of the conversion control transistor (at least one of the conversion control transistors 11_1 to 11_N) is electrically connected to the other of the source and the drain of the conversion control transistor included in another voltage conversion block or the other of the source and the drain of the output control transistor 13. Without limitation to the above, the back gate of the conversion control transistor (at least one of the conversion control transistors 11_1 to 11_N) may be electrically connected to the one of the source and the drain of the conversion control transistor included in another voltage conversion block or the one of the source and the drain of the output control transistor 13.

For example, in FIGS. 1A and 2A, the respective back gates of the conversion control transistors 11_1 to 11_N are electrically connected to the other of the source and the drain of the output control transistor 13. Further, the back gate of the output control transistor 13 is also electrically connected to the other of the source and the drain of the output control transistor 13.

In FIGS. 1B and 2B, the respective back gates of the conversion control transistors 11_1 to 11_N are electrically connected to the one of the source and the drain of the conversion control transistor 11_1. Further, the back gate of the output control transistor 13 is also electrically connected to the one of the source and the drain of the conversion control transistor 11_1.

Figure 3A:
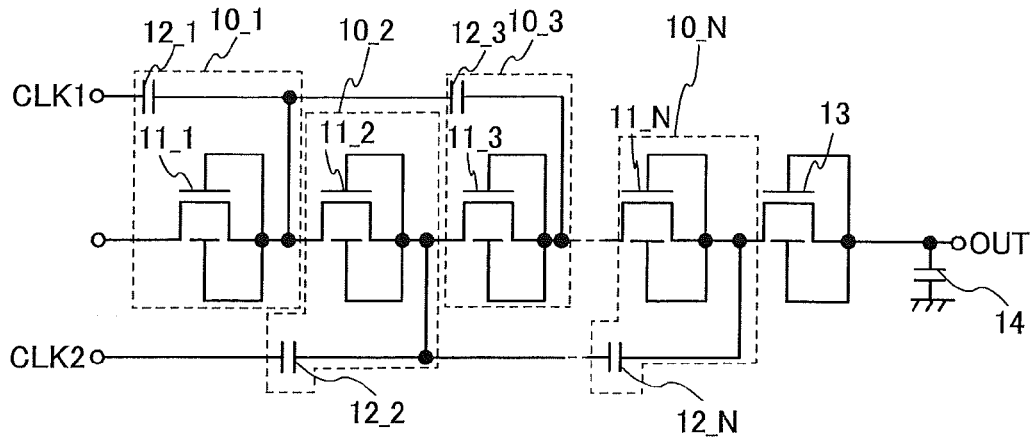
FIGS. 3A to 3C are examples of a voltage converter circuit.

Without limitation to the above, as illustrated in FIG. 3A for example, the back gate of the conversion control transistor 11_X in FIG. 1A may be electrically connected to the other of the source and the drain of the conversion control transistor 11_X. In this case, the back gate of the output control transistor 13 is electrically connected to the other of the source and the drain of the output control transistor 13.

Figure 3B:
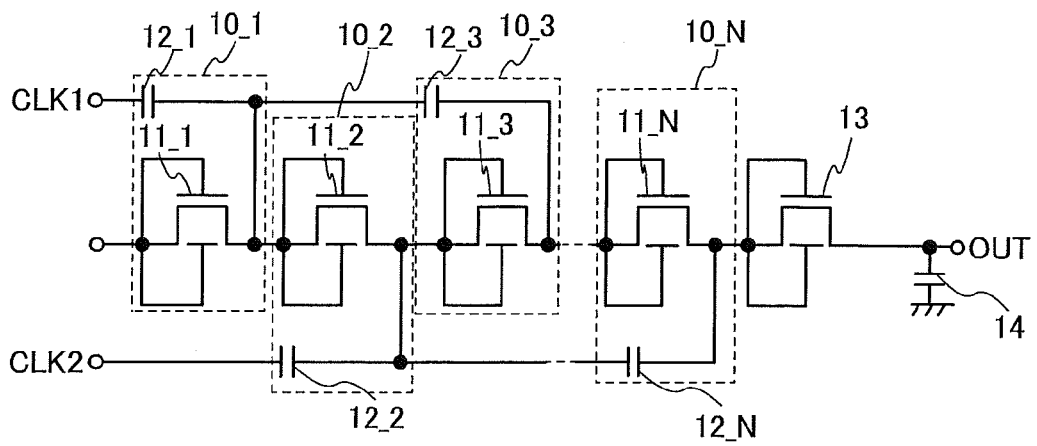

As illustrated in FIG. 3B, the back gate of the conversion control transistor 11_X in FIG. 1B may be electrically connected to the one of the source and the drain of the conversion control transistor 11_X. In this case, the back gate of the output control transistor 13 is electrically connected to the one of the source and the drain of the output control transistor 13.

Figure 3C:
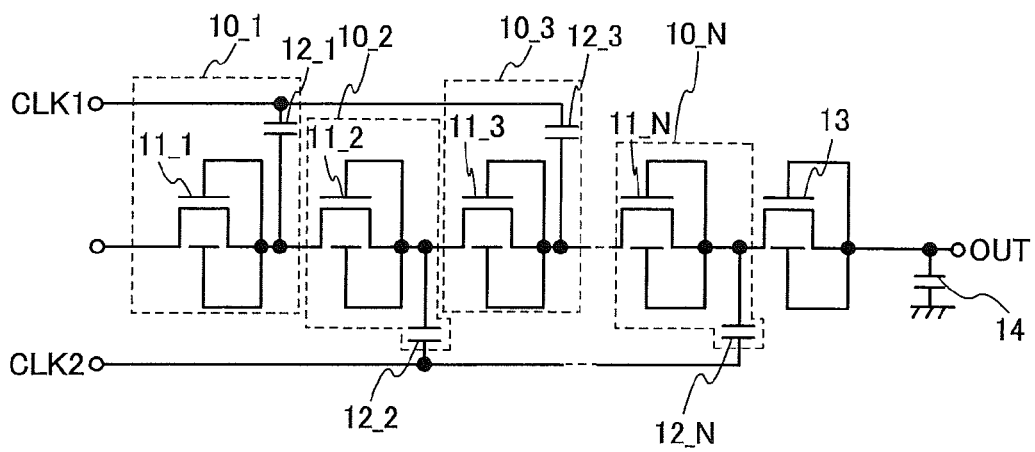

As illustrated in FIG. 3C, the back gate of the conversion control transistor 11_X in FIG. 2A may be electrically connected to the other of the source and the drain of the conversion control transistor 11_X. In this case, the back gate of the output control transistor 13 is electrically connected to the other of the source and the drain of the output control transistor 13. Without limitation to the above, the back gate of the conversion control transistor 11_X in FIG. 2B may be electrically connected to the one of the source and the drain of the conversion control transistor 11_X.

When a potential is applied to the back gate of the conversion control transistor, it is possible to mitigate the effect of the drain potential on the back channel, and thus to control the current flowing through the back channel of the transistor. Further, the threshold voltage of the transistor can be controlled. Moreover, since the potential applied to the back gate of the conversion control transistor is generated by the voltage converter circuit, an external potential does not need to be supplied additionally, which prevents an increase in the number of wirings.

The conversion control transistor may be a transistor including an element of Group 14 (e.g., silicon). The conversion control transistor may also be a transistor with low off-state current. The transistor with low off-state current includes, for example, a substantially i-type channel formation region including an oxide semiconductor with a wider bandgap than silicon. The transistor including an oxide semiconductor can be fabricated by the following manner, for example: impurities such as hydrogen or water are reduced as much as possible and oxygen is supplied so that oxygen vacancies are reduced as much as possible. At this time, the amount of hydrogen regarded as a donor impurity in the channel formation region, which is measured by secondary ion mass spectrometry (also referred to as SIMS), is preferably reduced to lower than or equal to $1 \times 10^{19}/cm^3$, further preferably lower than or equal to $1 \times 10^{18}/cm^3$.

The transistor containing the oxide semiconductor has low leakage current due to thermal excitation because of its wide bandgap. Further, the effective mass of a hole is large, which is 10 or more, and the height of the tunnel barrier is high, which is 2.8 eV or higher. Thus, the amount of tunnel current is small. Furthermore, the number of carriers in the semiconductor layer is very small; therefore, the off-state current can be made low. For example, the off-state current per micrometer of the channel width at 25° C. is lower than or equal to $1 \times 10^{-19}$ A (100 zA), preferably lower than or equal to $1 \times 10^{-22}$ A (100 yA). It is preferable that the off-state current of the transistor be as low as possible; the lowest value of the off-state current of the transistor is estimated to be about $1 \times 10^{-30}$ A/μm.

The oxide semiconductor can be, for example, an In-based metal oxide, a Zn-based metal oxide, an In—Zn-based metal oxide, or an In—Ga—Zn-based metal oxide.

It is also possible to use a metal oxide including another metal element instead of part or all of Ga in the In—Ga—Zn-based metal oxide. As the another metal element, a metal element that is capable of combining with more oxygen atoms than gallium can be used, for example, and specifically one or more elements of titanium, zirconium, hafnium, germanium, and tin can be used, for instance. Alternatively, as the another metal element, one or more elements of lanthanum, cerium, praseodymium, neodymium, samarium, europium, gadolinium, terbium, dysprosium, holmium, erbium, thulium, ytterbium, and lutetium may be used. These metal elements function as a stabilizer. Note that the amount of such a metal element added is determined so that the metal oxide can function as a semiconductor. When a metal element that is capable of combining with more oxygen atoms than gallium is used and oxygen is supplied to the metal oxide, oxygen vacancies in the metal oxide can be reduced.

As the transistor with low off-state current, a transistor whose channel formation region is formed using an oxide semiconductor containing indium, zinc, and gallium is used and the level of its off-state current is described here.

Figure 4:
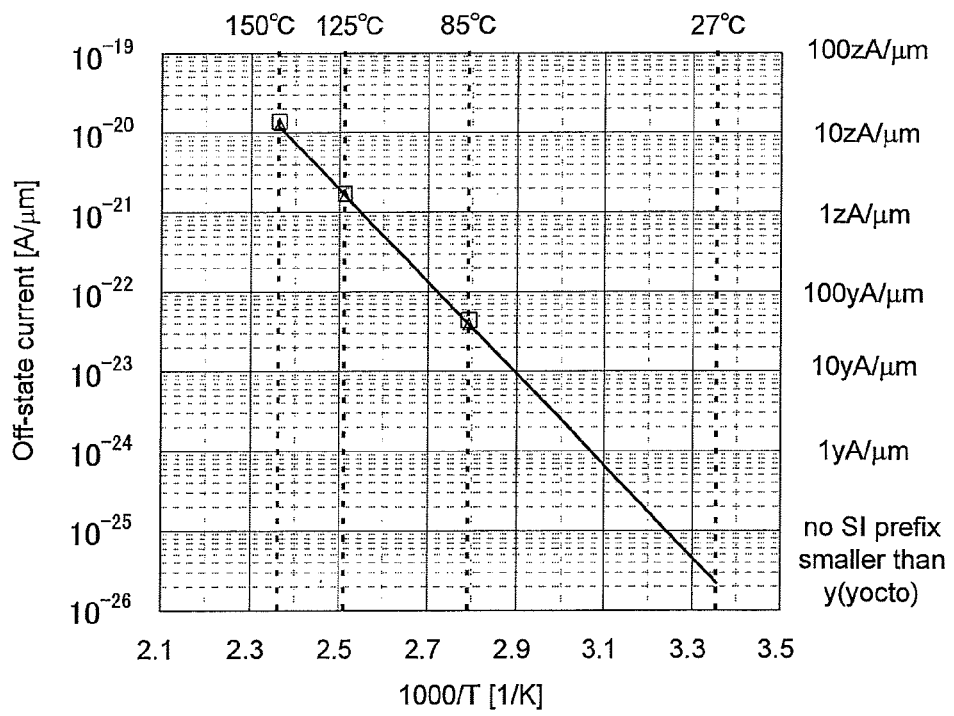
FIG. 4 is a graph showing the off-state current of a transistor.

For example, FIG. 4 shows an Arrhenius plot of off-state current estimated from off-state current per micrometer of channel width W of a transistor having a channel width W of 1 m (1000000 μm) and a channel length L of 3 μm when temperature changes to 150° C., 125° C., 85° C., and 27° C.

In FIG. 4, for example, the off-state current of the transistor at 27° C. is lower than or equal to $1 \times 10^{-25}$ A. FIG. 4 shows that the transistor including a channel formation region formed using an oxide semiconductor containing indium, zinc, and gallium has extremely low off-state current.

The structure of the oxide semiconductor layer cable of being used for a transistor will be described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) film, and the like.

The amorphous oxide semiconductor layer has disordered atomic arrangement and no crystalline component. A typical example thereof is an oxide semiconductor layer in which no crystal part exists even in a microscopic region, and the whole of the film is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS film is one of oxide semiconductor layers including a plurality of crystal parts, and most of the crystal parts each fits inside a cube whose one side is less than 100 nm Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor layer. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor layer of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

With the use of the CAAC-OS film in a transistor, change in electric characteristics of the transistor due to irradiation with visible light or ultraviolet light is small. Thus, the transistor has high reliability.

Note that each of the oxide semiconductor layers may have a stacked-layer structure including two or more layers of an amorphous oxide semiconductor layer, a microcrystalline oxide semiconductor layer, and a CAAC-OS layer, for example.

Note that the aforementioned transistor with low off-state current may be used as the output control transistor 13.

Next, an example of a method for driving the voltage converter circuit of this embodiment, for example, the voltage converter circuit illustrated in FIG. 1A, will be described with reference to FIGS. 5A to 5C. Here, 0 V is applied to one of the source and the drain of the conversion control transistor 11_1, for example. Description is made on the assumption that the conversion control transistors 11_1 to 11_N each are the aforementioned n-channel transistor with low off-state current.

Figure 5A:
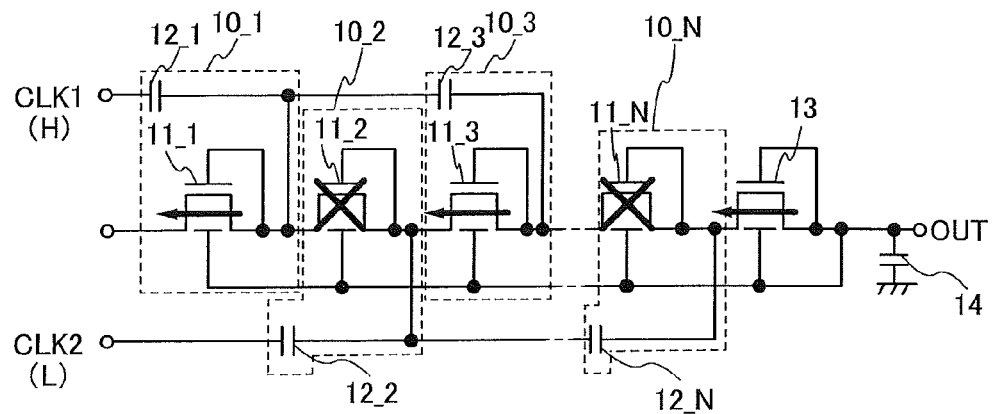
FIGS. 5A to 5C are examples of a method for driving a voltage converter circuit.

First, in a period T1, the clock signal CLK1 becomes a high level (H) while the clock signal CLK2 becomes a low level (L) as illustrated in FIG. 5A.

At this time, the conversion control transistor 11_M and the output control transistor 13 are turned on. When the potential of the other of the source and the drain of the conversion control transistor 11_M is changed to Vd11_M (the potential of the one of the source and the drain of the conversion control transistor 11_M)+Vth11_M (the threshold voltage of the conversion control transistor 11_M), the conversion control transistor 11_M is turned off. The conversion control transistor 11_L is off at this time.

Figure 5B:
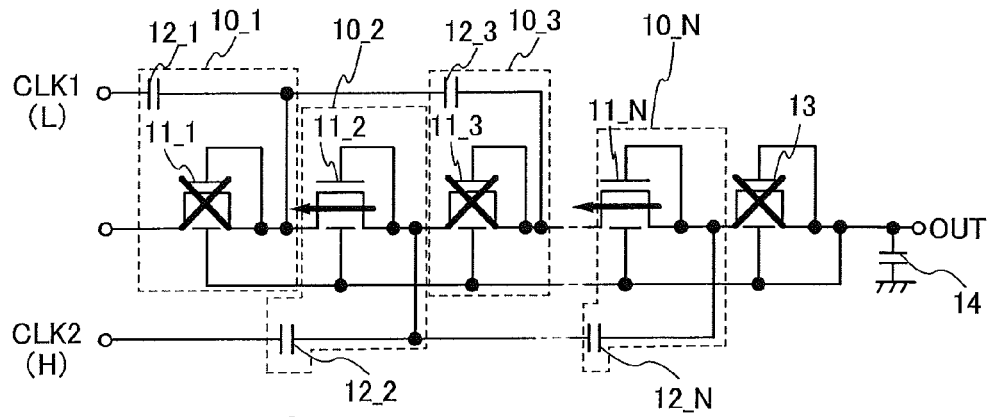

Then, in a period T2, the clock signal CLK1 becomes the low level (L) while the clock signal CLK2 becomes the high level (H) as illustrated in FIG. 5B.

At this time, the conversion control transistor 11_M and the output control transistor 13 are turned off. As the clock signal CLK1 is changed from the high level to the low level, the potential of the other of the source and the drain of the conversion control transistor 11_M is decreased to Vd11_M+Vth11_M−VH (the high-level potential of the clock signal CLK1). Further, the conversion control transistor 11_L is on at this time. When the potential of the other of the source and the drain of the conversion control transistor 11_L is changed to Vd11_L (the potential of the one of the source and the drain of the conversion control transistor 11_L)+Vth11_L (the threshold voltage of the conversion control transistor 11_L), the conversion control transistor 11_L is turned off. Accordingly, the potential of the other of the source and the drain of the conversion control transistor 11_L is converted into a potential lower than the input potential.

Note that contrary to the voltage converter circuit illustrated in FIG. 1A, in the voltage converter circuit illustrated in FIG. 1B for example, the potential of the other of the source and the drain of the conversion control transistor 11_L is converted into a potential higher than the input potential in accordance with the clock signal CLK1 and the clock signal CLK2.

Figure 5C:
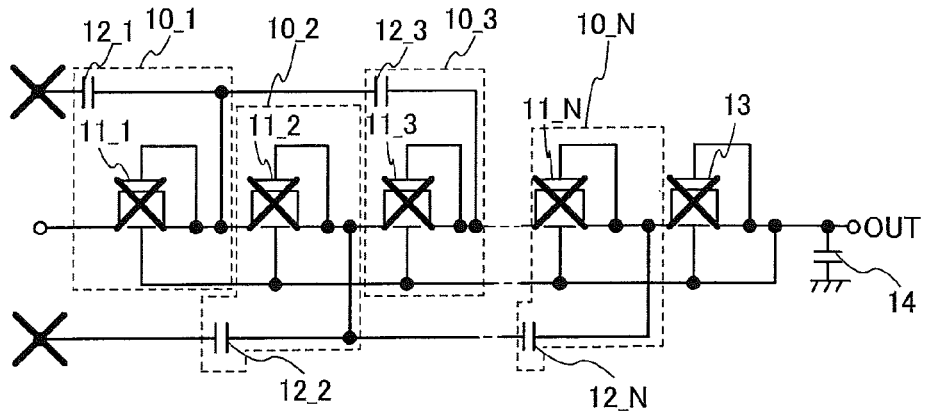

In a period T_CLKOFF during which the supply of the clock signals CLK1 and CLK2 to the voltage converter circuit is stopped, the conversion control transistor 11_M, the conversion control transistor 11_L, and the output control transistor 13 are turned off as illustrated in FIG. 5C. In the case where a transistor with low off-state current is used as the conversion control transistors 11_1 to 11_N, the conversion control transistor 11_M, the conversion control transistor 11_L, and the output control transistor 13 have low off-state current, and the potential generated by the voltage converter circuit is held for a certain period accordingly. Hence, the supply of the clock signals CLK1 and CLK2 to the voltage converter circuit can be stopped for a longer time, resulting in a reduction in power consumption.

The above is an example of the method for driving the voltage converter circuit illustrated in FIG. 1A.

Note that the structure of the voltage converter circuit of this embodiment is not limited to the above.

For example, the one of the source and the drain of the output control transistor 13 in the aforementioned voltage converter circuit may be electrically connected to the other of a source and a drain of a conversion control transistor 11_H (H is a natural number of 1 to N−1) included in a voltage conversion block 10_H. At this time, a back gate of the conversion control transistor 11_H included in the voltage conversion block 10_H is electrically connected to the other of a source and a drain of a conversion control transistor 11_I (I is a natural number of H+1 to N) included in a voltage conversion block 10_I. As a result, the potential of the back gate of the conversion control transistor 11_H can be made lower than that of the other of the source and the drain of the conversion control transistor 11_H.

For example, in the case where the aforementioned n-channel transistor with low off-state current is used as the conversion control transistor 11_H, when the potential of the back gate of the conversion control transistor 11_H is made lower than that of the other of the source and the drain of the conversion control transistor 11_H, the threshold voltage can be made to shift in the positive direction. It is thus possible to prevent the threshold voltage of the conversion control transistor 11_H from shifting in the negative direction due to degradation or the like.

Figure 6A:
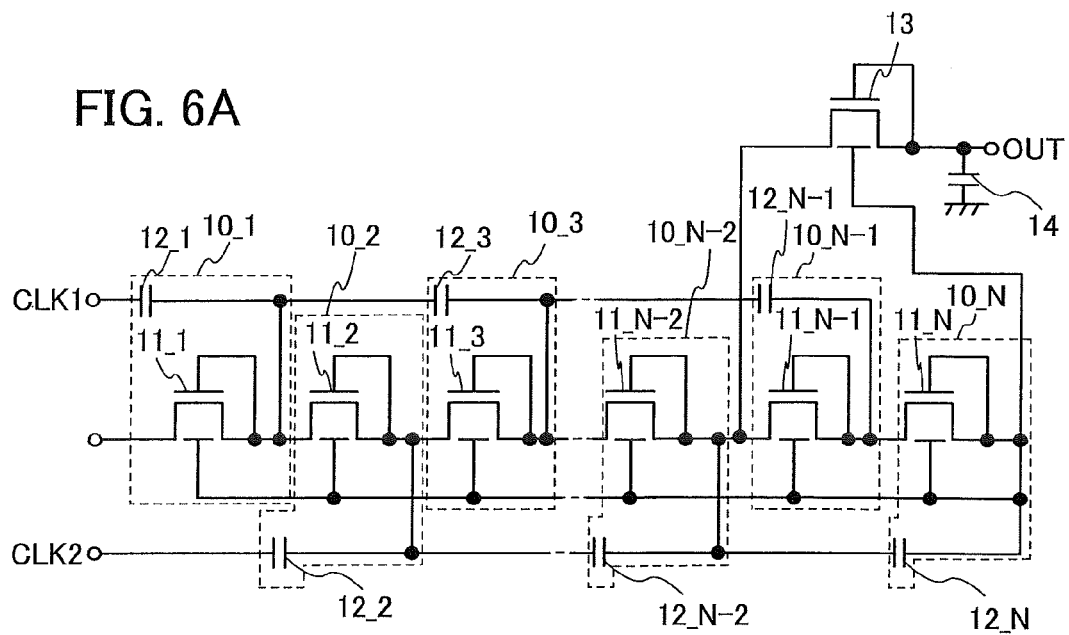
FIGS. 6A and 6B are examples of a voltage converter circuit.
Figure 6B:
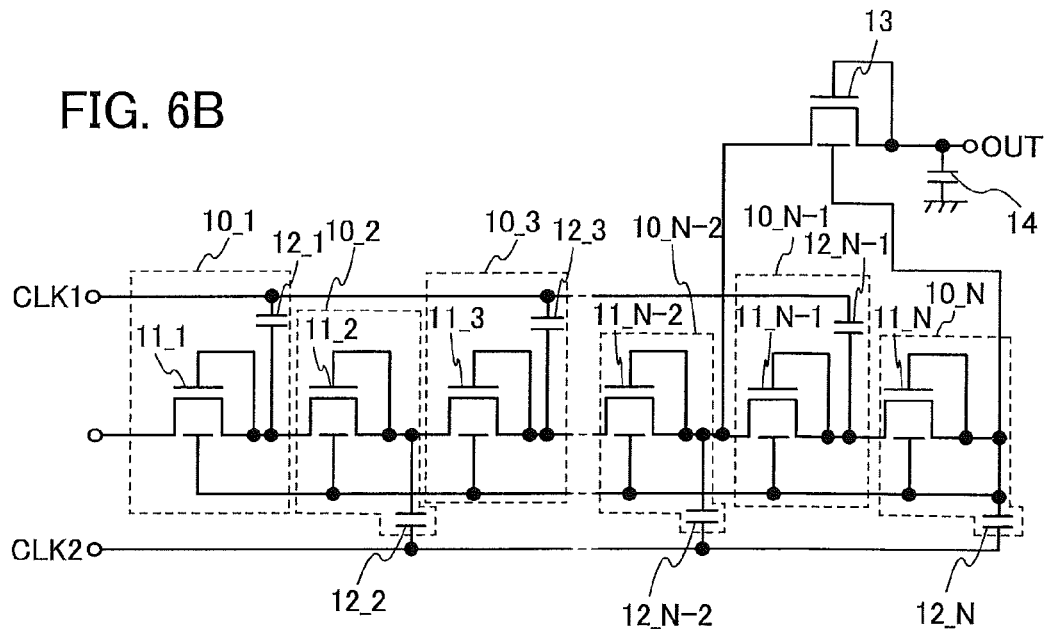

For example, FIGS. 6A and 6B each illustrate the case where H is N−2 and I is N: the one of the source and the drain of the output control transistor 13 is electrically connected to the other of a source and a drain of a conversion control transistor 11_N−2. Further, each of the back gates of the conversion control transistors 11_1 to 11_N is electrically connected to the other of the source and the drain of the conversion control transistor 11_N. Accordingly, the potential of each back gate of the conversion control transistors 11_1 to 11_N can be made lower than that of the other of the source and the drain of the conversion control transistor 11N−2.

A transistor 15 and a capacitor 16 may be additionally provided. At this time, a gate of the transistor 15 is electrically connected to the other of a source and a drain of a conversion control transistor 11_P (P is a natural number of 1 to N−3) included in a voltage conversion block 10_P. Further, the one of the source and the drain of the output control transistor 13 is electrically connected to the other of a source and a drain of a conversion control transistor 11_Q (Q is a natural number of P+1 to N−2) included in a voltage conversion block 10_Q. Moreover, one of a source and a drain of the transistor 15 is electrically connected to the other of a source and a drain of a conversion control transistor 11_R (R is a natural number of Q+1 to N−1) included in a voltage conversion block 10_R. Still further, one of a pair of electrodes of the capacitor 16 is electrically connected to the other of the source and the drain of the transistor 15, and a potential is applied to the other electrode. The capacitor 16 preferably has a higher capacitance than the capacitors 12_1 to 12_N.

The conversion control transistors 11_1 to 11_P each are preferably a transistor (e.g., a transistor including a channel formation region made of silicon) which has a higher off-state current than the aforementioned transistor with low off-state current. The conversion control transistors 11_P+1 to 11_N each are preferably the aforementioned transistor with low off-state current.

In the above structure, it is assumed that the conversion control transistors 11_1 to 11_N are n-channel transistors and the transistor 15 is a p-channel transistor. In a period during which the clock signals CLK1 and CLK2 are supplied to the voltage converter circuit, the transistor 15 is off because a voltage higher than the threshold voltage is applied between the gate and the source. The values of P and R are detained so that the transistor 15 can be in an off state at this time. A capacitor 12_P and a capacitor 12_R may each have a capacitance different from that of the other capacitors.

In the case where the supply of the clock signals CLK1 and CLK2 to the voltage converter circuit is stopped in the above structure, the potential of the other of the source and the drain of the conversion control transistor 11_P gradually increases due to the off-state current of each of the conversion control transistors 11_1 to 11_P. In that case, the transistor 15 is turned on when the voltage between the gate and the source becomes lower than the threshold voltage, and the potential of the other of the source and the drain of the conversion control transistor 11_R is stored in the capacitor 16.

With the above structure, in a period during which the clock signal is supplied, delay due to the capacitor 16 can be controlled by blocking the electrical conduction between the capacitor 16 and the conversion control transistor 11_R; and in a period during which the supply of the clock signal is stopped, the capacitor 16 is brought into conduction with the conversion control transistor 11_R, so that the potential of the other of the source and the drain of the conversion control transistor 11_R can be stored in the capacitor 16 for a longer time. Note that the voltage drop due to the capacitor 16 occurs when the transistor 15 is turned on; therefore, the potential of the other of the source and the drain of the conversion control transistor 11_R is preferably set to be higher than a desired potential by at least the potential equal to the voltage drop.

Figure 7A:
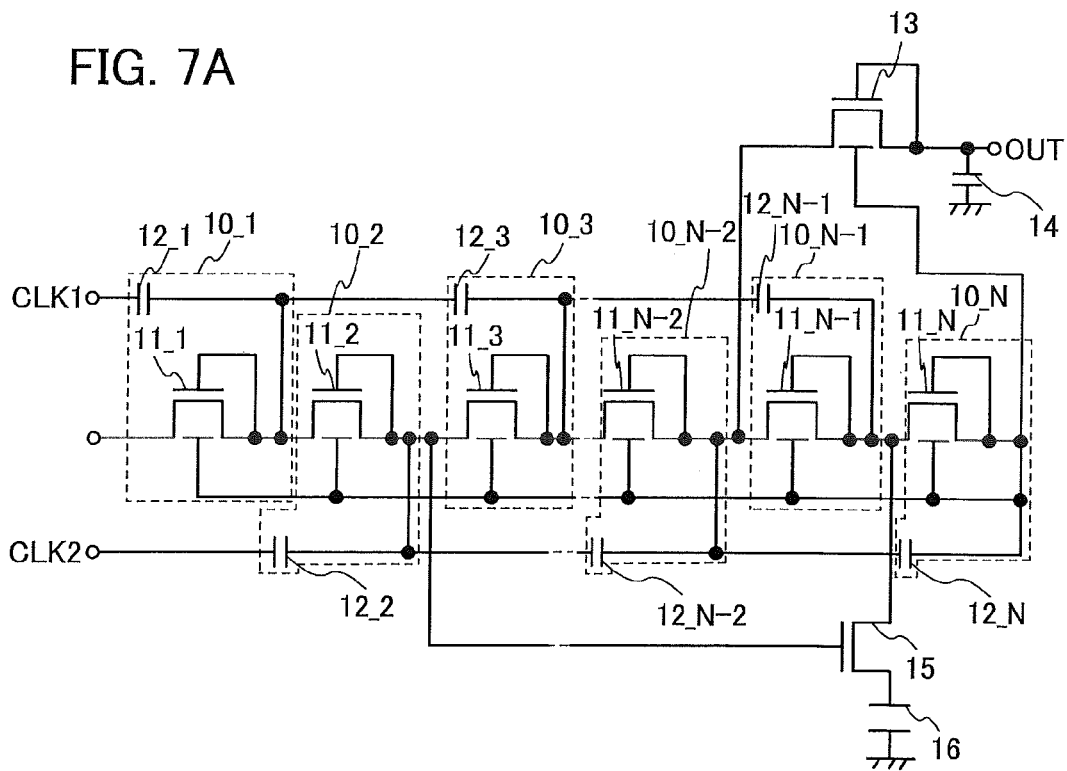
FIGS. 7A and 7B are examples of a voltage converter circuit.
Figure 7B:
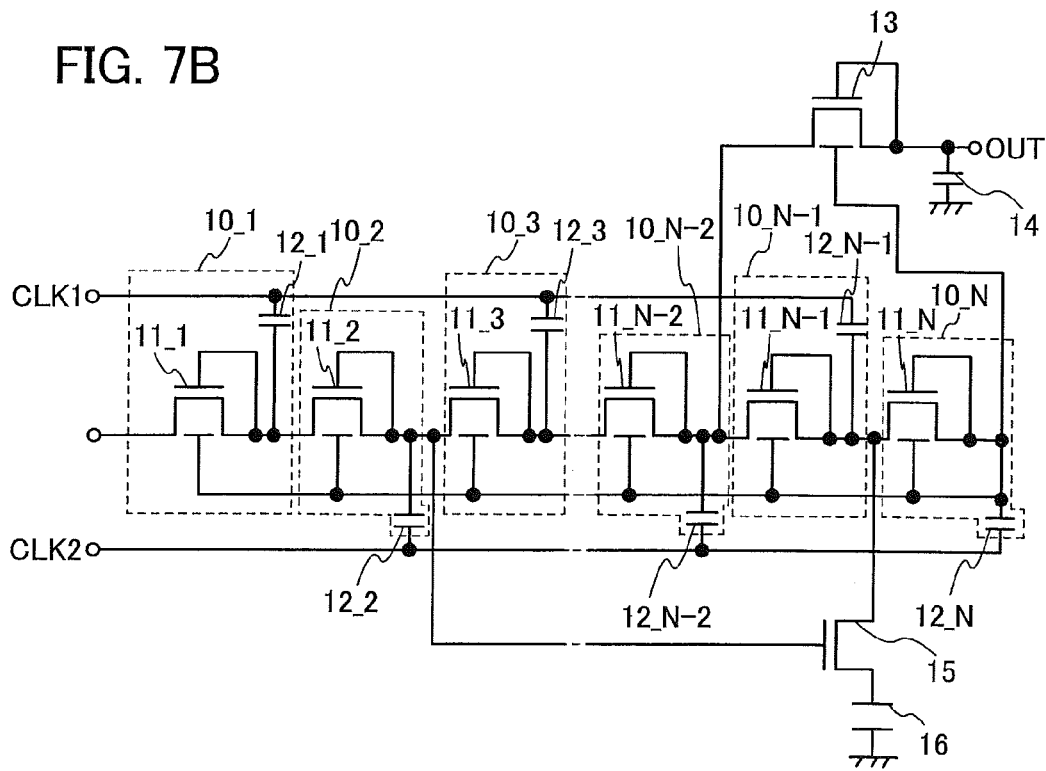

For example, a voltage converter circuit illustrated in FIG. 7A has a structure in which the transistor 15 and the capacitor 16 are added to the voltage converter circuit illustrated in FIG. 6A, and a voltage converter circuit illustrated in FIG. 7B has a structure in which the transistor 15 and the capacitor 16 are added to the voltage converter circuit illustrated in FIG. 6B.

The gate of the transistor 15 is electrically connected to the other of the source and the drain of the conversion control transistor 11_2. Further, the one of the source and the drain of the output control transistor 13 is electrically connected to the other of the source and the drain of the conversion control transistor 11_N−2. Furthermore, the one of the source and the drain of the transistor 15 is electrically connected to the other of a source and a drain of a conversion control transistor 11_N−1.

With the above structure, in a period during which the clock signal is supplied, delay due to the capacitor 16 can be controlled by blocking the electrical conduction between the capacitor 16 and the conversion control transistor 11_N−1;

and in a period during which the supply of the clock signal is stopped, the capacitor 16 is brought into conduction with the conversion control transistor 11_N−1, so that the potential of the other of the source and the drain of the conversion control transistor 11_N−1 can be stored in the capacitor 16 for a longer time.

As described above with reference to FIGS. 1A and 1B, FIGS. 2A and 2B, FIGS. 3A to 3C, FIG. 4, FIGS. 5A to 5C, FIGS. 6A and 6B, and FIGS. 7A and 7B, in examples of the voltage converter circuit of this embodiment, a potential generated by the voltage converter circuit is applied to a back gate of a conversion control transistor included in a voltage conversion block. Since the back gate of the transistor is not in a floating state, a current flowing through the back channel can be controlled so as to reduce a variation in the electrical characteristics of the transistor.

Further, in examples of the voltage converter circuit of this embodiment, a transistor with low off-state current is used as a transistor included in a voltage conversion block. The transistor with low off-state current allows the output potential to be held so as to reduce a variation in the output potential in the case where, for example, the supply of a clock signal to the voltage converter circuit is stopped. The use of the transistor with low off-state current also extends the period during which the supply of a clock signal can be stopped, resulting in a reduction in power consumption.

Embodiment 2

Described in this embodiment is an example of a semiconductor device including a power source circuit using the voltage converter circuit shown in Embodiment 1.

An example of the semiconductor device of this embodiment will be described with reference to FIG. 8 and FIG. 9.

Figure 8:
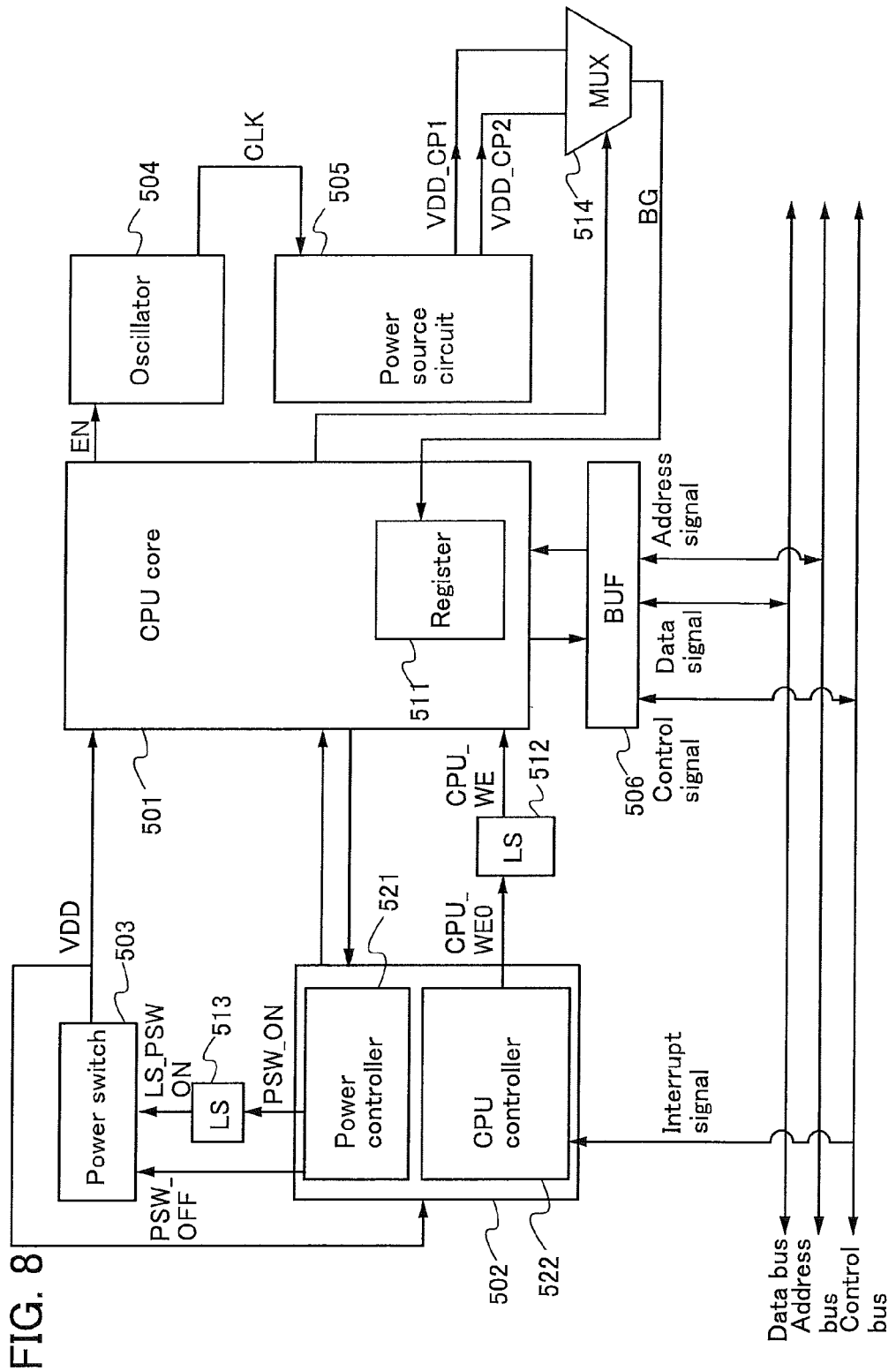
FIG. 8 is an example of a semiconductor device.

The semiconductor device illustrated in FIG. 8 includes a CPU core 501, a master controller 502, a power switch 503, an oscillator 504, a power source circuit 505, and a buffer (also referred to as BUF) 506.

The CPU core 501 is supplied with a power source voltage VDD and a control signal from the master controller 502.

The control signal input is, for example, a write control signal CPU_WE which is obtained by converting a write control signal CPU_WE0 output from the master controller 502 by a level shifter (also referred to as LS) 512. The control signal is not limited to this, and includes a control signal for power supply in the semiconductor device, a control signal for driving each circuit block when an instruction is executed based on a data signal, and the like.

In the CPU core 501, arithmetic processing is executed in accordance with the control signal from the master controller 502, so that various operations are conducted.

The CPU core 501 has a function of, for example, controlling the supply of a power source voltage VDD_IN to the CPU core 501. The supply of the power source voltage VDD_IN is controlled in such a manner that, for example, the power switch 503 is turned on or of by a power controller 521.

The CPU core 501 also has a function of controlling whether the oscillator 504 is stopped or not. The oscillator 504 is controlled by, for example, an enable signal EN input from the CPU core 501.

The CPU core 501 also has a function of controlling which of power source potentials VDD_CP1 and VDD_CP2 generated by the power source circuit 505 is applied to a register 511. For example, the CPU core 501 inputs a control signal to a multiplexer (also referred to as MUX) 514 which is a selection circuit, thereby controlling which of the power source potentials VDD_CP1 and VDD_CP2 is supplied.

The CPU core 501 includes the register 511.

The master controller 502 includes a power controller 521 for controlling the power switch 503, and a CPU controller 522 for controlling the CPU core 501.

The master controller 502 has a function of generating, in accordance with an instruction signal of the CPU core 501, a control signal for the CPU core 501, a control signal for the power switch 503, a control signal for the oscillator 504, and the like.

For example, the power controller 521 has a function of generating a control signal PSW_ON and a control signal PSW_OFF which control the power switch 503.

The CPU controller 522 has a function of generating the write control signal CPU_WE0 for controlling writing to the register 511, a control signal for controlling arithmetic processing in the CPU core 501, and the like.

Note that the supply of the power source voltage VDD_IN to the CPU controller 522 is controlled by an interrupt signal.

Whether the power switch 503 is turned on or not is controlled by a control signal LS_PSWON. The control signal LS_PSWON is obtained by converting the control signal PSW_ON output from the power controller 521 by a level shifter 513. Whether the power switch 503 is turned off or not is controlled by a control signal PSW_OFF output from the power controller 521.

The power switch 503 has a function of controlling whether to output the power source voltage VDD input from the outside. Note that a power source voltage with a different value may be generated based on the power source voltage output from the power switch 503, and then supplied as the power source voltage VDD to the CPU core 501 and the master controller 502.

The oscillator 504 has a function of generating and outputting a clock signal CLK. Whether the clock signal CLK is generated by the oscillator 504 or not is controlled by the CPU controller 522.

The power source circuit 505 has a function of generating the power source potentials VDD_CP1 and VDD_CP2 in accordance with the clock signal CLK.

The power source potentials VDD_CP1 and VDD_CP2 generated by the power source circuit 505 are supplied as a power source potential BG to a back gate of a transistor included in the register 511 through the multiplexer 514. At this time, the CPU core 501 controls which of the power source potentials VDD_CP1 and VDD_CP2 is supplied from the multiplexer 514.

The buffer 506 has a function of controlling the transmission of signals between the CPU core 501, and a data bus, an address bus, and a control bus. For example, a data signal is transmitted between the CPU core 501 and the data bus, an address signal is transmitted between the CPU core 501 and the address bus, and a control signal is transmitted between the CPU core 501 and the control bus.

Further, an example of a structure of the power source circuit 505 will be described with reference to FIG. 9.

Figure 9:
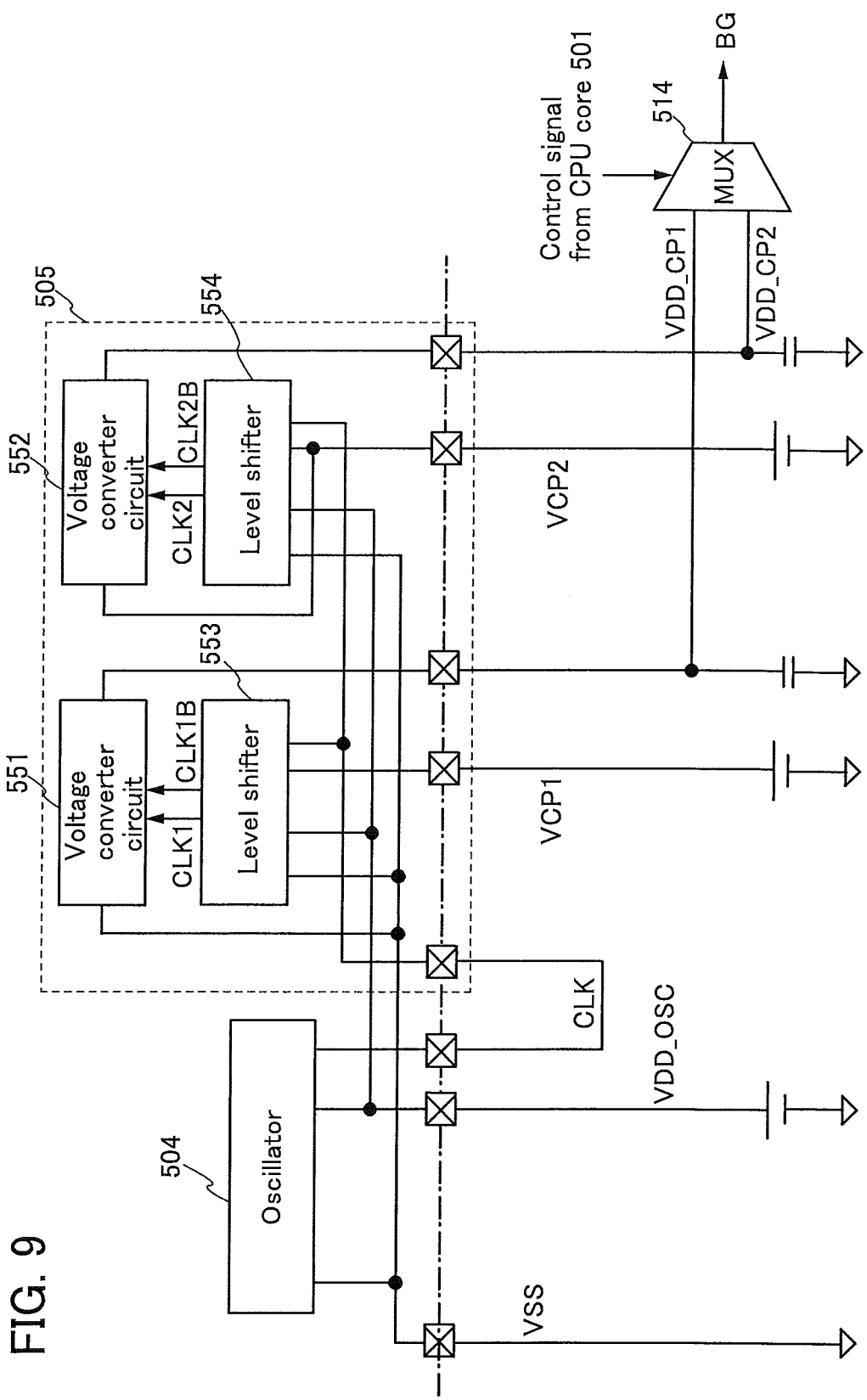
FIG. 9 is an example of a power source circuit.

The power source circuit 505 illustrated in FIG. 9 includes a voltage converter circuit 551, a voltage converter circuit 552, a level shifter 553, and a level shifter 554.

The voltage converter circuit 551 is supplied with a power source potential VSS, a clock signal CLK1, and its inverted clock signal CLK1B. The voltage converter circuit 551 has a function of converting the power source potential VSS in accordance with the clock signal CLK1 and the inverted clock signal CLK1B, thereby generating and outputting a power source potential VDD_CP1 which is a negative potential.

The voltage converter circuit 551 may be any voltage converter circuit capable of generating a negative potential (e.g., the voltage converter circuits illustrated in FIG. 1A, FIG. 2A, FIG. 3A, and FIG. 3C).

The voltage converter circuit 552 is supplied with a power source potential VCP2, a clock signal CLK2, and its inverted clock signal CLK2B. The voltage converter circuit 552 has a function of converting the power source potential VCP2 in accordance with the clock signal CLK2 and the inverted clock signal CLK2B, thereby generating and outputting a power source potential VDD_CP2 which is a positive potential.

The voltage converter circuit 552 may be any voltage converter circuit capable of generating a positive potential (e.g., the voltage converter circuits illustrated in FIG. 1B, FIG. 2B, and FIG. 3B).

The level shifter 553 is supplied with the power source potential VSS, a power source potential VDD_OSC, and a power source potential VCP1, and is also supplied with the clock signal CLK from the oscillator 504. The power source potential VDD_OSC is higher than the power source potential VSS, and the power source potential VCP1 is higher than the power source potential VDD_OSC. In the level shifter 553, the clock signal CLK is converted into a clock signal whose high level is equal to the power source potential VDD_OSC, and the clock signal whose high level is equal to the power source potential VDD_OSC is further converted into a clock signal whose high level is equal to the power source potential VCP1, whereby the clock signal CLK1 is generated. Note that the inverted clock signal CLK1B is generated by inverting the clock signal CLK1 whose high level is equal to the power source potential VCP1 with use of, for example, an inverter.

The level shifter 554 is supplied with the power source potential VSS, the power source potential VDD_OSC, and a power source potential VCP2, and is also supplied with the clock signal CLK from the oscillator 504. The power source potential VCP2 is higher than the power source potential VDD_OSC. In the level shifter 554, the clock signal CLK is converted into a clock signal whose high level is equal to the power source potential VDD_OSC, and the clock signal whose high level is equal to the power source potential VDD_OSC is further converted into a clock signal whose high level is equal to the power source potential VCP2, whereby the clock signal CLK2 is generated. Note that the inverted clock signal CLK2B is generated by inverting the clock signal whose high level is equal to the power source potential VCP2 with use of, for example, an inverter.

The power source potential VDD_CP1 generated by the voltage converter circuit 551 and the power source potential VDD_CP2 generated by the voltage converter circuit 552 are input to the multiplexer 514.

The above is an example of the structure of the power source circuit 505.

Next, an example of the CPU core 501 will be described with reference to FIG. 10.

Figure 10:
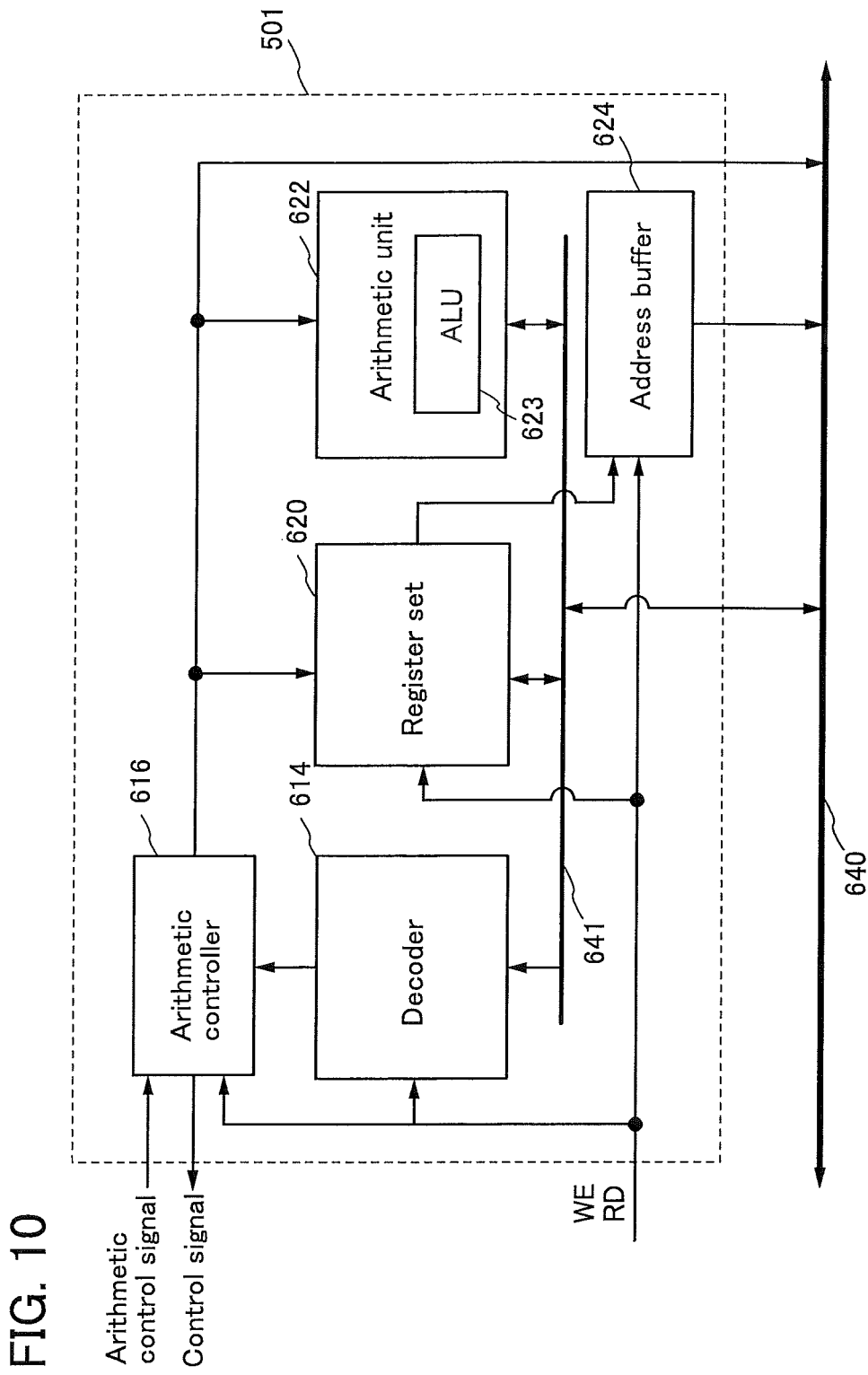
FIG. 10 is an example of a CPU core.

The CPU core 501 illustrated in FIG. 10 includes a decoder 614, an arithmetic controller 616, a register set 620, an arithmetic unit 622, and an address buffer 624.

The decoder 614 includes an instruction register and an instruction decoder. The decoder 614 has a function of decoding input instruction data and analyzing the instruction.

The arithmetic controller 616 includes a state generation unit and a register. Further, the state generation unit includes a register. The state generation unit generates a signal for determining the state of the semiconductor device.

The register set 620 includes a plurality of registers. The plurality of registers include registers functioning as a program counter, a general register, and an arithmetic register. The register set 620 has a function of storing data necessary for arithmetic processing.

The arithmetic unit 622 includes an arithmetic logic unit (ALU) 623. In the arithmetic unit 622, arithmetic processing of instruction data input from the arithmetic controller 616 is performed using the ALU 623. Note that the arithmetic unit 622 may also include a register.

The address buffer 624 includes a register. The address buffer 624 has a function of controlling the transmission of data signals in the register set 620 in accordance with the address of an address signal.

A write control signal WE and a read control signal RD are input to the CPU core 501. Moreover, 8-bit data is input to the CPU core 501 via a bus 640. A CPU control signal is also input to the CPU core 501.

Data of a 16-bit address and a bus control signal are output from the CPU core 501.

The write control signal WE and the read control signal RD are input to the arithmetic controller 616, the register set 620, and the address buffer 624. The 8-bit data is input to the register set 620 and the arithmetic unit 622 via the bus 640. The arithmetic control signal is input to the arithmetic controller 616. The arithmetic unit 622 executes arithmetic processing in accordance with the arithmetic control signal.

The 16-bit address data is output from the address buffer 624. The bus control signal is output from the arithmetic controller 616.

A data signal, an address signal, and an arithmetic control signal can be input/output to/from each circuit of the CPU core 501 via the bus 640 and a bus 641. The bus 640 is, for example, a data bus, an address bus, or a control bus.

Each register provided in the CPU core 501 has a function of storing data for a certain period of time in data processing.

Further, an example of a structure of the register (the register 511) which can be used in each circuit block will be described with reference to FIGS. 11A and 11B.

Figure 11A:
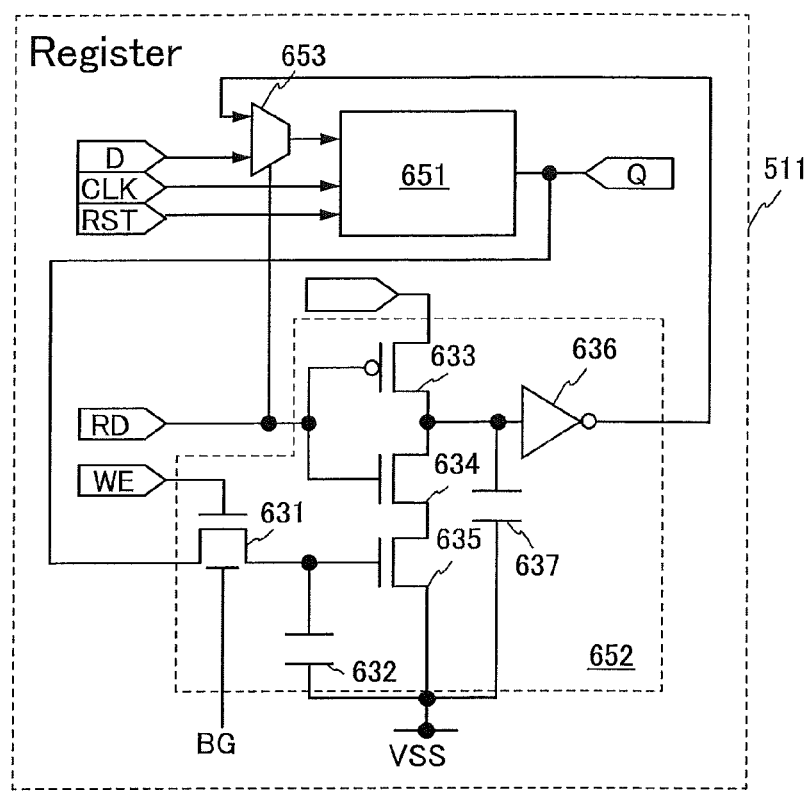
FIGS. 11A and 11B are examples of a register.

The register 511 illustrated in FIG. 11A includes a volatile memory circuit 651, a nonvolatile memory circuit 652, and a selector 653.

The volatile memory circuit 651 is supplied with a reset signal RST, a clock signal CLK, and a data signal D. The volatile memory circuit 651 has a function of storing data of the data signal D that is input in response to the clock signal CLK and outputting the data as a data signal Q. The reset signal RST, the clock signal CLK, and the data signal D are input through the CPU controller 522 and the buffer 506, for example.

The nonvolatile memory circuit 652 is supplied with a write control signal WE, a read control signal RD, and a data signal.

The nonvolatile memory circuit 652 has a function of storing data of an input data signal in accordance with the write control signal WE and outputting the stored data as a data signal in accordance with the read control signal RD.

In the selector 653, the data signal D or the data signal output from the nonvolatile memory circuit 652 is selected in accordance with the read control signal RD, and input to the volatile memory circuit 651.

The nonvolatile memory circuit 652 includes a transistor 631 and a capacitor 632.

The transistor 631, which is an n-channel transistor, functions as a selection transistor. One of a source and a drain of the transistor 631 is electrically connected to an output terminal of the volatile memory circuit 651. Further, a back gate of the transistor 631 is electrically connected to the multiplexer 514 illustrated in FIG. 9. The transistor 631 has a function of controlling the storage of a data signal output from the volatile memory circuit 651 in accordance with the write control signal WE.

As the transistor 631, the transistor with low off-state current described in Embodiment 1 can be used.

One of a pair of electrodes of the capacitor 632 is electrically connected to the other of the source and the drain of the transistor 631, and the other of the pair of electrodes is supplied with the power source potential VSS. The capacitor 632 has a function of holding charge based on data of a stored data signal. Since the off-state current of the transistor 631 is extremely low, the charge in the capacitor 632 is held and thus the data is stored even when the supply of the power source voltage is stopped.

The transistor 633 is a p-channel transistor. The power source potential VDD is supplied to one of a source and a drain of the transistor 633, and the read control signal RD is input to a gate of the transistor 633.

The transistor 634 is an n-channel transistor. One of a source and a drain of the transistor 634 is electrically connected to the other of the source and the drain of the transistor 633, and the read control signal RD is input to a gate of the transistor 634.

The transistor 635 is an n-channel transistor. One of a source and a drain of the transistor 635 is electrically connected to the other of the source and the drain of the transistor 634, and the power source potential VSS is input to the other of the source and the drain of the transistor 635.

An input terminal of an inverter 636 is electrically connected to the other of the source and the drain of the transistor 633. An output terminal of the inverter 636 is electrically connected to the input terminal of the selector 653.

One of a pair of electrodes of a capacitor 637 is electrically connected to the input terminal of the inverter 636, and the other of the pair of electrodes is supplied with the power source potential VSS. The capacitor 637 has a function of holding charge based on data of a data signal input to the inverter 636.

Note that without limitation to the above, the nonvolatile memory circuit 652 may include a phase-change random access memory (PRAM), a resistive random access memory (ReRAM), a magnetic random access memory (MRAM), or the like. For the MRAM, a magnetic tunnel junction element (MTJ element) can be used for example.

Next, an example of a method for driving the register 511 illustrated in FIG. 11A will be described.

First, in a normal operation period, the register 511 is supplied with the power source voltage, the reset signal RST, and the clock signal CLK. At this time, the selector 653 outputs data of the data signal D to the volatile memory circuit 651. The volatile memory circuit 651 stores the data of the data signal D that is input in accordance with the clock signal CLK. At this time, in response to the read control signal RD, the transistor 633 is turned on while the transistor 634 is turned off.

Then, in a backup period provided immediately before the supply of the power source voltage is stopped, in accordance with the pulse of the write control signal WE, the transistor 631 is turned on, the data of the data signal D is stored in the nonvolatile memory circuit 652, and the transistor 631 is turned off. After that, the supply of the clock signal CLK to the register is stopped, and then, the supply of the reset signal RST to the register is stopped. Note that when the transistor 631 is on, the back gate of the transistor 631 is supplied with the power source potential VDD_CP2 which is a positive potential from the multiplexer 514. At this time, in response to the read control signal RD, the transistor 633 is turned on while the transistor 634 is turned off.

Next, in a power stop period, the supply of the power source voltage to the register 511 is stopped. During this period, the stored data is held in the nonvolatile memory circuit 652 because the off-state current of the transistor 631 is low. Note that the supply of the power source voltage may be stopped by supplying the ground potential GND instead of the power source potential VDD. Note that when the transistor 631 is off, the back gate of the transistor 631 is supplied with the power source potential VDD_CP1 which is a negative potential from the multiplexer 514, so that the transistor 631 is kept off.

Then, in a recovery period immediately before a normal operation period, the supply of the power source voltage to the register 511 is restarted; then, the supply of the clock signal CLK is restarted, and after that, the supply of the reset signal RST is restarted. At this time, before the supply of the clock signal CLK is restarted, the wiring which is to be supplied with the clock signal CLK is set to the power source potential VDD. Moreover, in accordance with the pulse of the read control signal RD, the transistor 633 is turned off, the transistor 634 is turned on, and the data signal stored in the nonvolatile memory circuit 652 is output to the selector 653. The selector 653 outputs the data signal to the volatile memory circuit 651 in accordance with the pulse of the read control signal RD. Thus, the volatile memory circuit 651 can be returned to a state just before the power stop period.

Then, in a normal operation period, normal operation of the volatile memory circuit 651 is performed again.

The above is an example of the method for driving the register 511 illustrated in FIG. 11A.

Note that the structure of the register 511 is not limited to that illustrated in FIG. 11A.

Figure 11B:
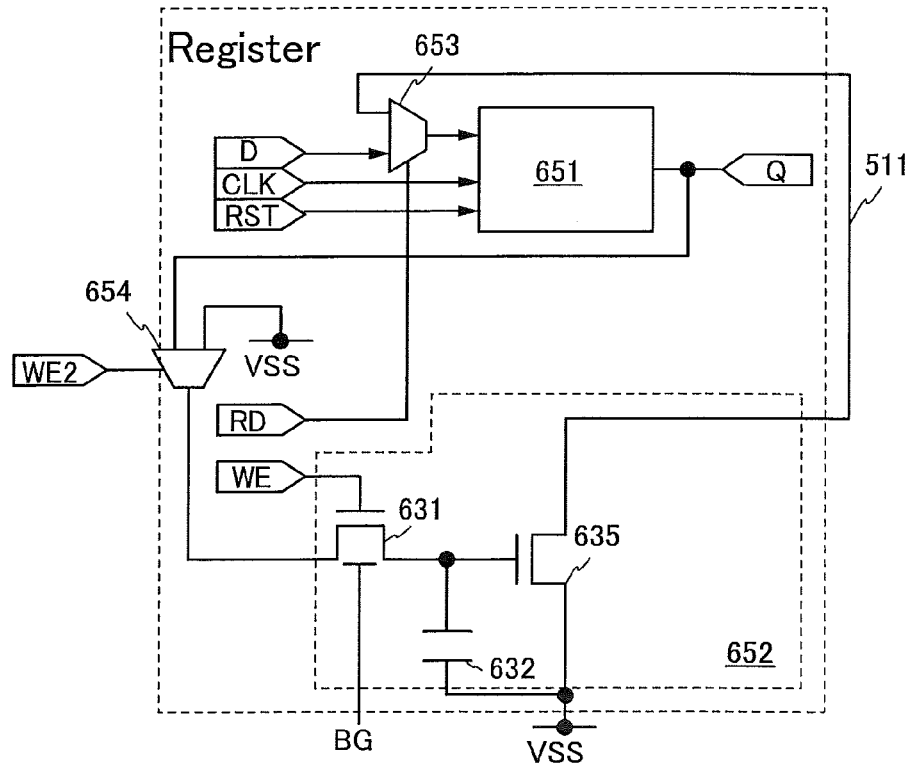

For example, the register 511 illustrated in FIG. 11B has a structure in which the transistors 633 and 634, the inverter 636, and the capacitor 637 are removed from the register 511 illustrated in FIG. 11A and a selector 654 is added to the register 511 illustrated in FIG. 11A. For the same components as those in the register 511 illustrated in FIG. 11A, the description of the register 511 in FIG. 11A is referred to as appropriate.

One of the source and the drain of the transistor 635 is electrically connected to the input terminal of the selector 653.

In the selector 654, the power source potential VSS to be data or the data signal output from the volatile memory circuit 651 is selected in accordance with the write control signal WE2, and input to the nonvolatile memory circuit 652.

Next, an example of a method for driving the register 511 illustrated in FIG. 11B will be described.

First, in a normal operation period, the register 511 is supplied with the power source voltage, the reset signal RST, and the clock signal CLK. At this time, the selector 653 outputs data of the data signal D to the volatile memory circuit 651. The volatile memory circuit 651 stores the data of the data signal D that is input in accordance with the clock signal CLK. In addition, the selector 654 outputs the power source potential VSS to the nonvolatile memory circuit 652 in accordance with the write control signal WE2. In the nonvolatile memory circuit 652, the transistor 631 is turned on in response to the pulse of the write control signal WE, and the power source potential VSS is stored as data in the nonvolatile memory circuit 652.

Then, in a backup period provided immediately before the supply of the power source voltage is stopped, the selector 654 does not supply the power source potential VSS but provides electrical conduction between the output terminal of the volatile memory circuit 651 and one of the source and the drain of the transistor 631 in accordance with the write control signal WE2. Further, in accordance with the pulse of the write control signal WE, the transistor 631 is turned on, the data of the data signal D is stored in the nonvolatile memory circuit 652, and the transistor 631 is turned off. At this time, the data of the nonvolatile memory circuit 652 is rewritten only when the potential of the data signal D is equal to the power source potential VDD. Furthermore, the supply of the clock signal CLK to the register is stopped, and then, the supply of the reset signal RST to the register 511 is stopped. Note that when the transistor 631 is on, the back gate of the transistor 631 is supplied with the power source potential VDD_CP2 which is a positive potential from the multiplexer 514.

Next, in a power stop period, the supply of the power source voltage to the register 511 is stopped. During this period, the stored data is held in the nonvolatile memory circuit 652 because the off-state current of the transistor 631 is low. Note that the supply of the power source voltage may be stopped by supplying the ground potential GND instead of the power source potential VDD. Note that when the transistor 631 is off, the back gate of the transistor 631 is supplied with the power source potential VDD_CP1 which is a negative potential from the multiplexer 514, so that the transistor 631 is kept off.

Then, in a recovery period immediately before a normal operation period, the supply of the power source voltage to the register 511 is restarted; then, the supply of the clock signal CLK is restarted, and after that, the supply of the reset signal RST is restarted. At this time, before the supply of the clock signal CLK is restarted, the wiring which is to be supplied with the clock signal CLK is set to the power source potential VDD. In accordance with the pulse of the read control signal RD, the selector 653 outputs to the volatile memory circuit 651 the data signal corresponding to the data stored in the nonvolatile memory circuit 652. Thus, the volatile memory circuit 651 can be returned to a state just before the power stop period.

Then, in a normal operation period, normal operation of the volatile memory circuit 651 is performed again.

The above is an example of the method for driving the register 511 illustrated in FIG. 11B.

By using the structure illustrated in FIG. 11B, the data of the power source potential VSS does not need to be written in the backup period, resulting in an increase in operation speed.

Figure 12:
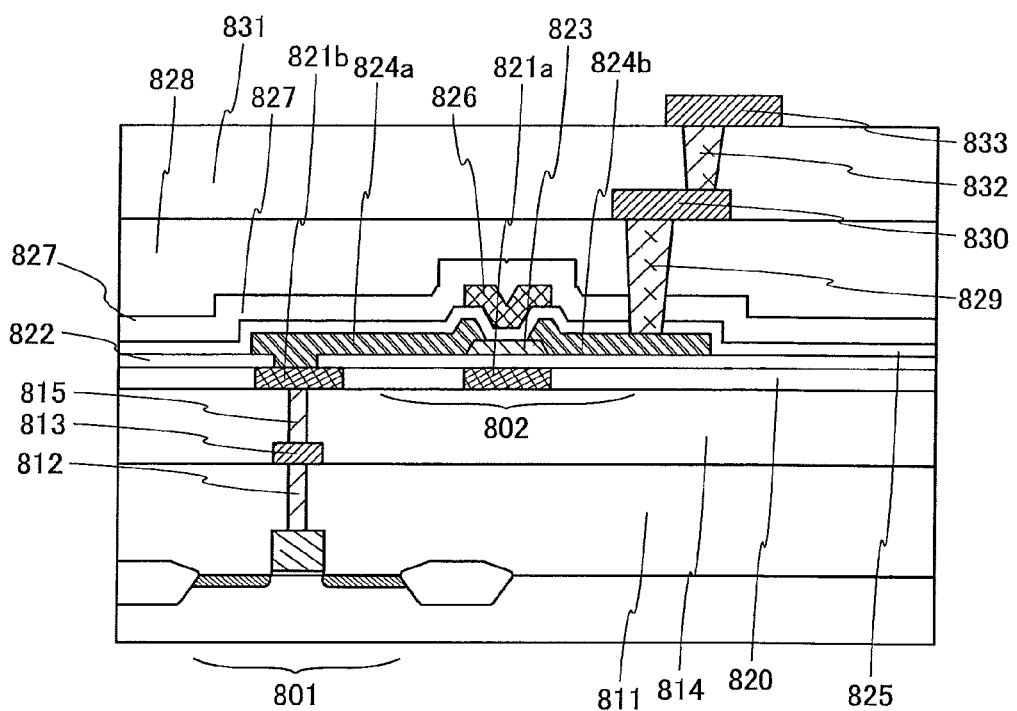
FIG. 12 is an example of a structure of a semiconductor device.

Next, an example of a structure of the semiconductor device in this embodiment will be shown in FIG. 12.

In the semiconductor device illustrated in FIG. 12, a transistor 802 including an oxide semiconductor in a channel formation region is stacked over a transistor 801 including silicon in a channel formation region, and a plurality of wiring layers are stacked between the transistor 801 and the transistor 802.

The transistor 801 is provided in a semiconductor substrate having an embedded insulating layer. The transistor 801 corresponds to the transistor 635 illustrated in FIGS. 11A and 11B, for example. Further, the conversion control transistor may have the same structure as the transistor 801.

The transistor 802 includes a conductive layer 821a embedded in an insulating layer 820, an insulating layer 822 over the conductive layer 821a, a semiconductor layer 823 overlapping with the conductive layer 821a with the insulating layer 822 interposed therebetween, conductive layers 824a and 824b electrically connected to the semiconductor layer 823, an insulating layer 825 over the semiconductor layer 823 and the conductive layers 824a and 824b, a conductive layer 826 overlapping with the semiconductor layer 823 with the insulating layer 825 interposed therebetween, and an insulating layer 827 over the conductive layer 826.

In that case, the conductive layer 821a functions as a back gate electrode of the transistor 802. The insulating layer 822 functions as a gate insulating layer of the transistor 802. The semiconductor layer 823 functions as a channel formation layer of the transistor 802. The conductive layers 824a and 824b function as a source electrode or a drain electrode of the transistor 802. The insulating layer 825 functions as a gate insulating layer of the transistor 802. The conductive layer 826 functions as a gate electrode of the transistor 802. The transistor 802 corresponds to the transistor 631 illustrated in FIGS. 11A and 11B, for example. Note that the conversion control transistor may have the same structure as the transistor 802.

Through an opening provided in the insulating layer 822, the conductive layer 824a is electrically connected to a conductive layer 821b which is formed using the same conductive layer as the conductive layer 821a. The conductive layer 821b is electrically connected to a gate electrode of the transistor 801 through a wiring layer 812 embedded in an insulating layer 811, a wiring layer 813 over the wiring layer 812, and a wiring layer 815 which is over the wiring layer 813 and embedded in an insulating layer 814. In this case, part of the insulating layer 820 is removed by chemical mechanical polishing (also referred to as CMP), for example, so that the surfaces of the conductive layers 821a and 821b are exposed.

Furthermore, a wiring layer 830 and a wiring layer 833 are stacked in order over the transistor 802. The wiring layer 830 is electrically connected to the conductive layer 824b through a wiring layer 829 which is embedded in the insulating layer 825, the insulating layer 827, and an insulating layer 828 over the insulating layer 827. The wiring layer 833 is electrically connected to the wiring layer 830 through a wiring layer 832 which is embedded in an insulating layer 831 over the wiring layer 830.

Each component will be further described. Note that each layer may have a layered structure.

Each of the wiring layers 812, 813, 815, 829, 830, 832, and 833 can be, for example, a layer containing a metal material such as molybdenum, titanium, chromium, tantalum, magnesium, silver, tungsten, aluminum, copper, neodymium, ruthenium, or scandium.

Each of the insulating layers 811, 814, 820, 822, 825, and 827 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

Note that in order that the semiconductor layer 823 is supersaturated with oxygen, insulating layers in contact with the oxide semiconductor layer 823 (e.g., the insulating layers 822 and 825) each preferably include a layer containing excess oxygen.

The insulating layer containing excess oxygen is formed using a silicon oxide film or a silicon oxynitride film containing a large amount of oxygen as a result of film formation by a plasma CVD method or a sputtering method under the conditions which are set as appropriate. Alternatively, oxygen may be added to at least one of the semiconductor layer 823 and the insulating layers in contact with the semiconductor layer 823 by an ion implantation method, an ion doping method, or plasma treatment.

In addition, blocking layers against oxygen, hydrogen, or water are preferably provided as the insulating layers 822 and 827 outside the insulating layers containing excess oxygen. Accordingly, it is possible to prevent diffusion of oxygen contained in the oxide semiconductor layer to the outside and entry of hydrogen, water, or the like into the oxide semiconductor layer from the outside. The blocking layers can be, for example, layers containing a material such as silicon nitride, aluminum oxide, aluminum nitride, gallium oxide, gallium oxynitride, yttrium oxide, yttrium oxynitride, aluminum oxynitride, aluminum nitride oxide, or hafnium oxide.

In the case where the semiconductor layer 823 is surrounded by the insulating layers containing excess oxygen or the blocking layers, the oxide semiconductor layer can contain oxygen in a proportion which is substantially the same as that in the stoichiometric composition, or in a supersaturated state in which oxygen exceeding the stoichiometric composition is contained.

For example, the insulating layer 822 may be formed by a stack of a silicon nitride layer and a silicon oxynitride layer.

For example, the insulating layer 825 may be formed using a silicon oxynitride layer.

For example, the insulating layer 827 may be formed by a stack of a silicon nitride layer and a silicon oxynitride layer.

For example, the insulating layers 814 and 820 may be formed using a silicon oxide layer which is formed by a CVD method using a tetraethyl orthosilicate (TEOS) gas. In that case, the planarity of the insulating layers 814 and 820 can be improved.

As the semiconductor layer 823, for example, an oxide semiconductor layer can be used.

As the oxide semiconductor, for example, any of the oxide semiconductors shown in Embodiment 1 can be used.

Further, the semiconductor layer 823 may have a layered structure including a first oxide semiconductor layer with an atomic ratio of In:Ga:Zn=1:1:1, a second oxide semiconductor layer with an atomic ratio of In:Ga:Zn=3:1:2, and a third oxide semiconductor layer with an atomic ratio of In:Ga:Zn=1:1:1. By employing this layered structure for the semiconductor layer 823, the transistor 802 can have a buried channel structure in which a channel is formed apart from the insulating layers (822 and 825) in contact with the semiconductor layer 823, whereby the transistor 802 has good electrical characteristics with less variation.

The aforementioned transistor including the oxide semiconductor can be fabricated by the following manner impurities such as hydrogen or water are reduced as much as possible and oxygen is supplied so that oxygen vacancies are reduced as much as possible. At this time, the amount of hydrogen regarded as a donor impurity in the channel formation region, which is measured by secondary ion mass spectrometry (also referred to as SIMS), is preferably reduced to lower than or equal to $1 \times 10^{19}/cm^3$, further preferably lower than or equal to $1 \times 10^{18}/cm^3$.

For example, a layer containing oxygen is used as the layer in contact with the oxide semiconductor layer, and heat treatment is performed; thus, the oxide semiconductor layer can be highly purified.

In addition, the oxide semiconductor layer just after its formation is preferably supersaturated with oxygen so that the proportion of oxygen is higher than that in the stoichiometric composition. For example, in the case of using sputtering, the oxide semiconductor layer is preferably formed under the condition where the proportion of oxygen in a deposition gas is high, and particularly in an oxygen atmosphere (e.g., oxygen gas: 100%).

In a sputtering apparatus, the amount of moisture remaining in a deposition chamber is preferably small. Therefore, an entrapment vacuum pump is preferably used in the sputtering apparatus. Further, a cold trap may be used.

For formation of the oxide semiconductor layer, heat treatment is preferably performed. The temperature of the heat treatment is preferably higher than or equal to 150° C. and lower than the strain point of the substrate, more preferably higher than or equal to 300° C. and lower than or equal to 450° C. Note that the heat treatment may be performed more than once.

A rapid thermal annealing (RTA) apparatus such as a gas rapid thermal annealing (GRTA) apparatus or a lamp rapid thermal annealing (LRTA) apparatus can be used as a heat treatment apparatus for the heat treatment. Alternatively, another heat treatment apparatus such as an electric furnace may be used.

After the heat treatment, a high-purity oxygen gas, a high-purity $N_2O$ gas, or ultra-dry air (having a dew point of −40° C. or lower, preferably −60° C. or lower) is preferably introduced into the furnace where the heat treatment has been performed while the heating temperature is being maintained or being decreased. In that case, it is preferable that the oxygen gas or the $N_2O$ gas do not contain water, hydrogen, and the like. The purity of the oxygen gas or the $N_2O$ gas which is introduced into the heat treatment apparatus is preferably 6N or higher, more preferably 7N or higher. That is, the impurity concentration of the oxygen gas or the $N_2O$ gas is preferably 1 ppm or lower, more preferably 0.1 ppm or lower. Through this step, oxygen is supplied to the oxide semiconductor layer, and defects due to oxygen vacancies in the oxide semiconductor layer can be reduced. Note that the introduction of the high-purity oxygen gas, the high-purity $N_2O$ gas, or the ultra-dry air may be performed at the time of the above heat treatment.

Note that the oxide semiconductor may be a CAAC-OS.

For example, the oxide semiconductor layer that is a CAAC-OS can be formed by a sputtering method. In that case, the sputtering is performed using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the sputtered particle reaches a substrate while maintaining its crystal state, whereby a crystal state of the sputtering target is transferred to a substrate. In this manner, the CAAC-OS is formed.

For the deposition of the CAAC-OS, the following conditions are preferably used.

For example, when the CAAC-OS is formed while the amount of impurity entering the CAAC-OS is reduced, the crystal state of the oxide semiconductor can be prevented from being broken by the impurities. For example, it is preferable to reduce the concentration of impurities (e.g., hydrogen, water, carbon dioxide, and nitrogen) existing in a deposition chamber of a sputtering apparatus. Further, the concentration of impurities in a deposition gas is preferably reduced. For example, a deposition gas whose dew point is −80° C. or lower, preferably −100° C. or lower is preferably used as a deposition gas.

It is preferable that the temperature of the substrate at the time of deposition be high. In the case of high substrate temperature, when the flat-plate-like sputtered particle reaches the substrate, migration of the sputtered particle occurs, so that a flat plane of the sputtered particle can be attached to the substrate. For example, an oxide semiconductor film is deposited at a substrate heating temperature of 100° C. to 740° C., preferably 200° C. to 500° C., whereby the oxide semiconductor layer is formed.

Further, it is preferable to reduce plasma damage at the time of deposition by increasing the oxygen percentage in the deposition gas and optimizing electric power. For example, the oxygen percentage in the deposition gas is preferably 30 vol % or higher, still preferably 100 vol %.

Further, the concentration of impurities such as silicon in the oxide semiconductor is preferably reduced to lower than $2.5 \times 10^{21}$ atoms/cm$^3$, preferably less than $4.0 \times 10^{19}$ atoms/cm$^3$, and more preferably less than $2.0 \times 10^{18}$ atoms/cm$^3$. Such a reduction in the concentration of impurities prevents the CAAC-OS from being damaged by the impurities. Note that as the impurities, titanium, hafnium, or the like can also be given in addition to silicon.

Each of the conductive layers 821a, 821b, and 826 can be, for example, a layer containing a metal material such as molybdenum, titanium, chromium, tantalum, magnesium, silver, tungsten, aluminum, copper, neodymium, ruthenium, or scandium.

Each of the conductive layers 824a and 824b can be, for example, a layer containing a metal material such as molybdenum, titanium, chromium, tantalum, magnesium, silver, tungsten, aluminum, copper, neodymium, ruthenium, or scandium. As the conductive layers 824a and 824b, a layer of a metal oxide that functions as a conductor and transmits light can also be used, for example. For example, indium oxide-zinc oxide or indium tin oxide can be used.

The insulating layers 828 and 831 each can be, for example, a layer containing an organic resin material.

As illustrated in FIG. 12, an example of the semiconductor device in this embodiment includes a stack of different transistors, which results in a reduction in the circuit area.

The above is the description of an example of the structure of the semiconductor device illustrated in FIG. 12.

As described with reference to FIG. 8, FIG. 9, FIG. 10, FIGS. 11A and 11B, and FIG. 12, in an example of the semiconductor device of this embodiment, the power source circuit is formed using the voltage converter circuit shown in Embodiment 1, and the semiconductor device is formed using the oscillator and the CPU core including the register. In addition, the CPU core controls whether a positive potential or a negative potential is applied to a back gate of a transistor in the register. As a result, a variation in the electrical characteristics (e.g., threshold voltage) of the transistor in the register can be reduced.

Embodiment 3

In this embodiment, examples of electronic devices including the semiconductor device which is one embodiment of the present invention will be described with reference to FIGS. 13A to 13F.

Figure 13A:
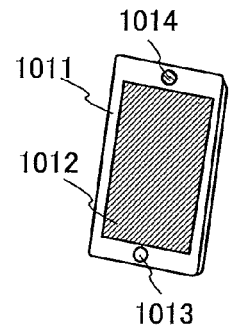
FIGS. 13A to 13F are examples of an electronic device.

An electronic device illustrated in FIG. 13A is an example of a portable information terminal.

The electronic device illustrated in FIG. 13A includes a housing 1011, a panel 1012 provided on the housing 1011, a button 1013, and a speaker 1014.

The housing 1011 may be provided with a connection terminal for connecting the electronic device to an external device and a button for operating the electronic device.

The panel 1012 is a display panel (display). The panel 1012 preferably has a function of a touch panel.

The button 1013 is provided on the housing 1011. When the button 1013 is a power button, for example, pressing the button 1013 can turn on or off the electronic device.

The speaker 1014 is provided on the housing 1011. The speaker 1014 outputs sound.

Note that the housing 1011 may be provided with a microphone, in which case the electronic device in FIG. 13A can function as a telephone set, for example.

In the electronic device illustrated in FIG. 13A, the semiconductor device which is one embodiment of the present invention is provided inside the housing 1011.

The electronic device illustrated in FIG. 13A functions as one or more of a telephone set, an e-book reader, a personal computer, and a game machine, for example.

Figure 13B:
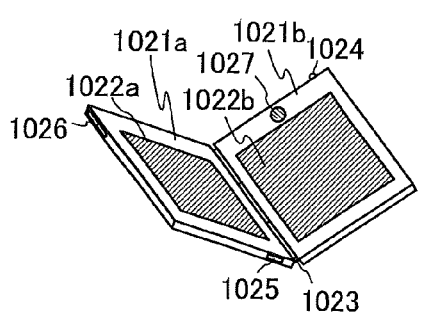

An electronic device illustrated in FIG. 13B is an example of a folding digital assistant.

The electronic device illustrated in FIG. 13B includes a housing 1021a, a housing 1021b, a panel 1022a provided on the housing 1021a, a panel 1022b provided on the housing 1021b, a hinge 1023, a button 1024, a connection terminal 1025, a storage medium inserting portion 1026, and a speaker 1027.

The housing 1021a and the housing 1021b are connected to each other by the hinge 1023.

The panels 1022a and 1022b are display panels (displays). The panels 1022a and 1022b preferably have a function of a touch panel.

Since the electronic device in FIG. 13B includes the hinge 1023, it can be folded so that the panels 1022a and 1022b face each other.

The button 1024 is provided on the housing 1021b. Note that the button 1024 may be provided on the housing 1021a. When the button 1024 is a power button, for example, pressing the button 1024 can control the supply of a power voltage to the electronic device.

The connection terminal 1025 is provided on the housing 1021a. Note that the connection terminal 1025 may be provided on the housing 1021b. Alternatively, a plurality of connection terminals 1025 may be provided on one or both of the housings 1021a and 1021b. The connection terminal 1025 is a terminal for connecting the electronic device in FIG. 13B to another device.

The storage media inserting portion 1026 is provided on the housing 1021a. The storage medium insertion portion 1026 may be provided on the housing 1021b. Alternatively, a plurality of storage medium insertion portions 1026 may be provided on one or both of the housings 1021a and 1021b. For example, when a card-type recording medium is inserted into the recording medium insertion portion, data can be read to the electronic device from the card-type recording medium or data stored in the electronic device can be written to the card-type recording medium.

The speaker 1027 is provided on the housing 1021b. The speaker 1027 outputs sound. Note that the speaker 1027 may be provided on the housing 1021a.

Note that the housing 1021*a* or the housing 1021*b* may be provided with a microphone, in which case the electronic device in FIG. 13B can function as a telephone set, for example.

In the electronic device illustrated in FIG. 13B, the semiconductor device which is one embodiment of the present invention is provided inside the housing 1021*a* or the housing 1021*b*.

The electronic device illustrated in FIG. 13B functions as one or more of a telephone set, an e-book reader, a personal computer, and a game machine, for example.

Figure 13C:
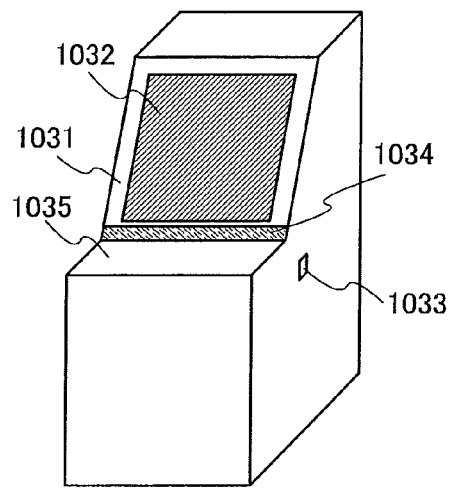

An electronic device illustrated in FIG. 13C is an example of a stationary information terminal. The stationary information terminal illustrated in FIG. 13C includes a housing 1031, a panel 1032 provided on the housing 1031, a button 1033, and a speaker 1034.

The panel 1032 is a display panel (display). The panel 1032 preferably has a function of a touch panel.

Note that a panel similar to the panel 1032 may be provided on a deck portion 1035 of the housing 1031. This panel preferably has a function of a touch panel.

The housing 1031 may be provided with one or more of a ticket slot from which a ticket or the like is dispensed, a coin slot, and a bill slot.

The button 1033 is provided on the housing 1031. When the button 1033 is a power button, for example, pressing the button 1033 can control the supply of a power voltage to the electronic device.

The speaker 1034 is provided on the housing 1031. The speaker 1034 outputs sound.

In the electronic device illustrated in FIG. 13C, the semiconductor device which is one embodiment of the present invention is provided inside the housing 1031.

The electronic device illustrated in FIG. 13C functions as, for example, an automated teller machine, an information communication terminal for ordering a ticket or the like (also referred to as a multi-media station), or a game machine.

Figure 13D:
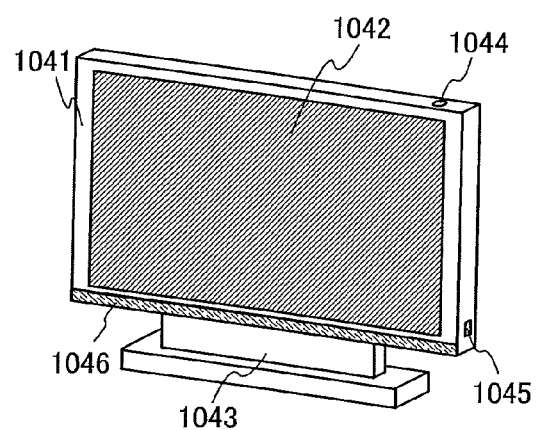

FIG. 13D illustrates another example of a stationary information terminal. The electronic device illustrated in FIG. 13D includes a housing 1041, a panel 1042 provided on the housing 1041, a support 1043 supporting the housing 1041, a button 1044, a connection terminal 1045, and a speaker 1046.

Note that a connection terminal for connecting the housing 1041 to an external device may be provided.

The panel 1042 functions as a display panel (display).

The button 1044 is provided on the housing 1041. When the button 1044 is a power button, for example, pressing the button 1044 can control the supply of a power voltage to the electronic device.

The connection terminal 1045 is provided on the housing 1041. The connection terminal 1045 is a terminal for connecting the electronic device in FIG. 13D to another device. For example, when the electronic device in FIG. 13D and a personal computer are connected with the connection terminal 1045, an image corresponding to a data signal input from the personal computer can be displayed on the panel 1042. For example, when the panel 1042 of the electronic device illustrated in FIG. 13D is larger than a panel of an electronic device connected thereto, a displayed image of the electronic device can be enlarged, in which case a plurality of viewers can recognize the image at the same time with ease.

The speaker 1046 is provided on the housing 1041. The speaker 1046 outputs sound.

In the electronic device illustrated in FIG. 13D, the semiconductor device which is one embodiment of the present invention is provided inside the housing 1041.

The electronic device illustrated in FIG. 13D functions as one or more of an output monitor, a personal computer, and a television set, for example.

Figure 13E:
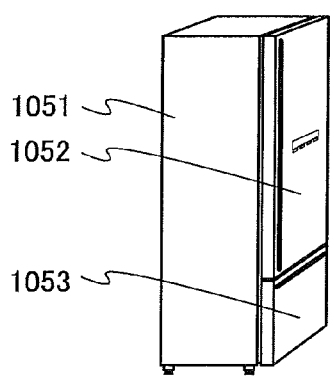

FIG. 13E illustrates an example of an electric refrigerator-freezer. The electronic device illustrated in FIG. 13E includes a housing 1051, a refrigerator door 1052, and a freezer door 1053.

In the electronic device illustrated in FIG. 13E, the semiconductor device which is one embodiment of the present invention is provided inside the housing 1051. With this structure, supply of a power voltage to the semiconductor device in the housing 1051 can be controlled in response to opening and closing of the refrigerator door 1052 and the freezer door 1053, for example.

Figure 13F:
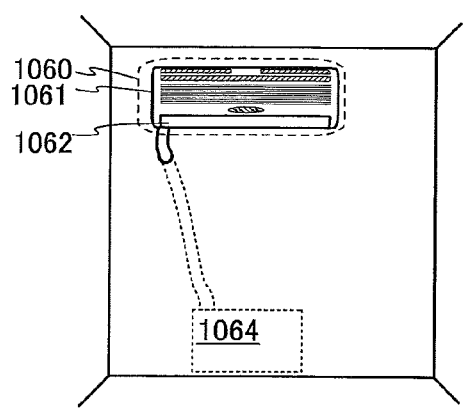

FIG. 13F illustrates an example of an air conditioner. The electronic device illustrated in FIG. 13F includes an indoor unit 1060 and an outdoor unit 1064.

The indoor unit 1060 includes a housing 1061 and a ventilation duct 1062.

In the electronic device illustrated in FIG. 13F, the semiconductor device which is one embodiment of the present invention is provided inside the housing 1061. With this structure, supply of a power voltage to the semiconductor device in the housing 1061 can be controlled in response to a signal from a remote controller, for example.

Note that although the separated air conditioner including the indoor unit and the outdoor unit is shown in FIG. 13F as an example, it may be an air conditioner in which the functions of an indoor unit and an outdoor unit are integrated in one housing.

The above is a description of the electronic devices illustrated in FIGS. 13A to 13F.

As has been described with reference to FIGS. 13A to 13F, the electronic devices in this embodiment consume less power by using the semiconductor device which is one embodiment of the present invention.

This application is based on Japanese Patent Application serial No. 2012-193330 filed with Japan Patent Office on Sep. 3, 2012, the entire contents of which are hereby incorporated by reference.

What is claimed is:
1. A semiconductor device comprising:
a power source circuit comprising:
   a voltage converter circuit configured to generate a potential by using a first clock signal, the voltage converter circuit comprising a first transistor; and
a CPU core comprising:
   a register comprising:
     a selector;
     a first memory circuit configured to store data, the first memory circuit being supplied with a second clock signal; and
     a second memory circuit configured to store the data output from the first memory circuit, the second memory circuit comprising a second transistor and a first capacitor,
wherein an output terminal of the selector is electrically connected to an input terminal of the first memory circuit,
wherein an input terminal of the selector is electrically connected to an output terminal of the second memory circuit, wherein each of the first transistor and the second transistor comprises a channel formation region comprising an oxide semiconductor,
wherein a gate of the first transistor is electrically connected to one of a source and a drain of the first transistor,
wherein a back gate of the first transistor is electrically connected to the one of the source and the drain of the first transistor,
wherein one of a source and a drain of the second transistor is electrically connected to the first capacitor, and
wherein a back gate of the second transistor is supplied with the potential.

2. The semiconductor device according to claim 1,
wherein an output terminal of the voltage converter circuit is electrically connected to the one of the source and the drain of the first transistor.

3. The semiconductor device according to claim 2,
wherein the voltage converter circuit further comprises a second capacitor,
wherein a first electrode of the second capacitor is electrically connected to the other of the source and the drain of the first transistor, and
wherein a second electrode of the second capacitor is supplied with the first clock signal.

4. The semiconductor device according to claim 3,
wherein the first electrode of the second capacitor is electrically connected to the other of the source and the drain of the first transistor via at least a third capacitor.

5. The semiconductor device according to claim 1,
wherein an output terminal of the voltage converter circuit is electrically connected to the other of the source and the drain of the first transistor.

6. The semiconductor device according to claim 5,
wherein the back gate of the first transistor is electrically connected to the one of the source and the drain of the first transistor via at least a third transistor.

7. The semiconductor device according to claim 5,
wherein the voltage converter circuit further comprises a second capacitor,
wherein a first electrode of the second capacitor is electrically connected to the one of the source and the drain of the first transistor, and
wherein a second electrode of the second capacitor is supplied with the first clock signal.

8. The semiconductor device according to claim 7,
wherein the first electrode of the second capacitor is electrically connected to the one of the source and the drain of the first transistor via at least a third capacitor.

9. A semiconductor device comprising:
a power source circuit comprising:
  a first voltage converter circuit configured to generate a first potential by using a first clock signal, the first voltage converter circuit comprising a first transistor; and
  a second voltage converter circuit configured to generate a second potential by using a second clock signal, the second voltage converter circuit comprising a second transistor; and
a CPU core comprising:
  a register comprising:
    a first memory circuit configured to store data, the first memory circuit being supplied with a third clock signal; and
    a second memory circuit configured to store the data output from the first memory circuit, the second memory circuit comprising a third transistor and a first capacitor,
wherein a gate of the first transistor is electrically connected to one of a source and a drain of the first transistor,
wherein a back gate of the first transistor is electrically connected to the one of the source and the drain of the first transistor,
wherein a gate of the second transistor is electrically connected to one of a source and a drain of the second transistor,
wherein a back gate of the second transistor is electrically connected to the one of the source and the drain of the second transistor,
wherein one of a source and a drain of the third transistor is electrically connected to the first capacitor, and
wherein a back gate of the third transistor is supplied with the first potential or the second potential.

10. The semiconductor device according to claim 9,
wherein each of the first transistor, the second transistor and the third transistor comprises a channel formation region comprising an oxide semiconductor.

11. The semiconductor device according to claim 9,
wherein an output terminal of the first voltage converter circuit is electrically connected to the one of the source and the drain of the first transistor, and
wherein an output terminal of the second voltage converter circuit is electrically connected to the other of the source and the drain of the second transistor.

12. The semiconductor device according to claim 11,
wherein the back gate of the second transistor is electrically connected to the one of the source and the drain of the second transistor via at least a fourth transistor.

13. The semiconductor device according to claim 11,
wherein the first voltage converter circuit further comprises a second capacitor,
wherein the second voltage converter circuit further comprises a third capacitor,
wherein a first electrode of the second capacitor is electrically connected to the other of the source and the drain of the first transistor,
wherein a second electrode of the second capacitor is supplied with the first clock signal,
wherein a first electrode of the third capacitor is electrically connected to the one of the source and the drain of the second transistor, and
wherein a second electrode of the second capacitor is supplied with the second clock signal.

14. The semiconductor device according to claim 13,
wherein the first electrode of the second capacitor is electrically connected to the other of the source and the drain of the first transistor via at least a fourth capacitor, and
wherein the first electrode of the third capacitor is electrically connected to the one of the source and the drain of the second transistor via at least a fifth capacitor.

15. A semiconductor device comprising:
a power source circuit comprising:
  a first voltage converter circuit configured to generate a first potential, the first voltage converter circuit comprising a first transistor; and
  a second voltage converter circuit configured to generate a second potential, the second voltage converter circuit comprising a second transistor;
an oscillator configured to output a clock signal to the power source circuit; and
a CPU core configured to control whether an operation of the oscillator is stopped or not, the CPU core comprising:

a register comprising:
  a first memory circuit configured to store data in a period during which a power source voltage is applied to the CPU core; and
  a second memory circuit configured to store data in a period during which supply of the power source voltage to the CPU core is stopped, the second memory circuit comprising a third transistor and a first capacitor,
wherein a gate of the first transistor is electrically connected to one of a source and a drain of the first transistor,
wherein a back gate of the first transistor is electrically connected to the one of the source and the drain of the first transistor,
wherein a gate of the second transistor is electrically connected to one of a source and a drain of the second transistor,
wherein a back gate of the second transistor is electrically connected to the one of the source and the drain of the second transistor,
wherein one of a source and a drain of the third transistor is electrically connected to the first capacitor, and
wherein the CPU core is further configured to control whether the first potential or the second potential is applied to a back gate of the third transistor.

16. The semiconductor device according to claim 15, wherein each of the first transistor, the second transistor and the third transistor comprises a channel formation region comprising an oxide semiconductor.

17. The semiconductor device according to claim 15, wherein an output terminal of the first voltage converter circuit is electrically connected to the one of the source and the drain of the first transistor, and
wherein an output terminal of the second voltage converter circuit is electrically connected to the other of the source and the drain of the second transistor.

18. The semiconductor device according to claim 17, wherein the back gate of the second transistor is electrically connected to the one of the source and the drain of the second transistor via at least a fourth transistor.

19. The semiconductor device according to claim 17, wherein the first voltage converter circuit further comprises a second capacitor,
wherein the second voltage converter circuit further comprises a third capacitor,
wherein an electrode of the second capacitor is electrically connected to the other of the source and the drain of the first transistor, and
wherein an electrode of the third capacitor is electrically connected to the one of the source and the drain of the second transistor.

20. The semiconductor device according to claim 19, wherein the electrode of the second capacitor is electrically connected to the other of the source and the drain of the first transistor via at least a fourth capacitor, and
wherein the electrode of the third capacitor is electrically connected to the one of the source and the drain of the second transistor via at least a fifth capacitor.

21. A semiconductor device comprising:
a first transistor;
a second transistor;
a third transistor;
a first capacitor;
a second capacitor; and
a third capacitor,
wherein a CPU core comprises a register comprising the second transistor and the second capacitor,
wherein each of the first transistor and the second transistor comprises a channel formation region comprising an oxide semiconductor,
wherein the third transistor comprises a channel formation region comprising silicon,
wherein a gate of the first transistor is electrically connected to one of a source and a drain of the first transistor,
wherein a back gate of the first transistor is electrically connected to the one of the source and the drain of the first transistor,
wherein the one of the source and the drain of the first transistor is electrically connected to the first capacitor,
wherein one of a source and a drain of the second transistor is electrically connected to the second capacitor,
wherein a back gate of the second transistor is electrically connected to the one of the source and the drain of the first transistor,
wherein a gate of the third transistor is electrically connected to one of a source and a drain of the third transistor,
wherein the one of the source and the drain of the third transistor is electrically connected to the other of the source and the drain of the first transistor,
wherein the one of the source and the drain of the third transistor is electrically connected to a first electrode of the third capacitor, and
wherein a second electrode of the third capacitor is supplied with a clock signal.

22. The semiconductor device according to claim 21, wherein a voltage converter circuit comprises the first transistor, the first capacitor, the third transistor and the third capacitor, and
wherein the voltage converter circuit is configured to generate a potential by using the clock signal.

23. The semiconductor device according to claim 21, wherein the third transistor is an n-channel transistor.

24. A semiconductor device comprising:
a first transistor;
a second transistor;
a third transistor;
a first capacitor;
a second capacitor; and
a third capacitor,
wherein a CPU core comprises a register comprising the second transistor and the second capacitor,
wherein each of the first transistor, the second transistor and the third transistor comprises a channel formation region comprising an oxide semiconductor,
wherein a gate of the first transistor is electrically connected to one of a source and a drain of the first transistor,
wherein a back gate of the first transistor is electrically connected to the one of the source and the drain of the first transistor,
wherein the one of the source and the drain of the first transistor is electrically connected to the first capacitor,
wherein one of a source and a drain of the second transistor is electrically connected to the second capacitor,
wherein a back gate of the second transistor is electrically connected to the one of the source and the drain of the first transistor,
wherein a gate of the third transistor is electrically connected to one of a source and a drain of the third transistor,
wherein the one of the source and the drain of the third transistor is electrically connected to the other of the source and the drain of the first transistor, wherein the one of the source and the drain of the third transistor is electrically connected to a first electrode of the third capacitor, and wherein a second electrode of the third capacitor is supplied with a clock signal.

25. The semiconductor device according to claim 24, wherein a voltage converter circuit comprises the first transistor, the first capacitor, the third transistor and the third capacitor, and wherein the voltage converter circuit is configured to generate a potential by using the clock signal.

* * * * *